(12) United States Patent
Turunen et al.

(10) Patent No.: US 12,038,274 B2
(45) Date of Patent: Jul. 16, 2024

(54) DEFORMABLE SENSOR

(71) Applicant: Forciot Oy, Tampere (FI)

(72) Inventors: Mikko Turunen, Akaa (FI); Petri Järvinen, Tampere (FI); Pekka Iso-Ketola, Sastamala (FI)

(73) Assignee: FORCIOT OY, Tampere (FI)

( * ) Notice: Subject to any disclaimer, the term of this patent is extended or adjusted under 35 U.S.C. 154(b) by 336 days.

(21) Appl. No.: 17/632,991

(22) PCT Filed: Sep. 4, 2020

(86) PCT No.: PCT/EP2020/074760
§ 371 (c)(1),
(2) Date: Feb. 4, 2022

(87) PCT Pub. No.: WO2021/043975
PCT Pub. Date: Mar. 11, 2021

(65) Prior Publication Data
US 2022/0260434 A1 Aug. 18, 2022

(30) Foreign Application Priority Data
Sep. 6, 2019 (EP) .................................. 19397526

(51) Int. Cl.
*G01B 7/16* (2006.01)
*G01D 5/241* (2006.01)
(Continued)

(52) U.S. Cl.
CPC ............. *G01B 7/16* (2013.01); *G01D 5/241* (2013.01); *G01L 1/146* (2013.01); *G01L 1/18* (2013.01);
(Continued)

(58) Field of Classification Search
CPC ... G01L 1/14; G01L 1/146; G01L 1/16; G01L 1/18; G01B 7/16; G01B 7/18; H05K 1/189; H05K 3/326; H05K 2201/10151
See application file for complete search history.

(56) References Cited

U.S. PATENT DOCUMENTS

| | | | |
|---|---|---|---|
| 2011/0226069 A1* | 9/2011 | Kim | G01L 1/2293 29/25.01 |
| 2015/0248159 A1* | 9/2015 | Luo | G01L 1/186 427/117 |
| 2019/0339143 A1* | 11/2019 | Järvinen | G01L 1/146 |

FOREIGN PATENT DOCUMENTS

| | | |
|---|---|---|
| CN | 109564137 | 4/2019 |
| EP | 3482180 A1 | 5/2019 |

(Continued)

OTHER PUBLICATIONS

PCT International Search Report for PCT Application No. PCT/EP2020/074760 dated Nov. 26, 2020 (3 pages).
(Continued)

*Primary Examiner* — Benjamin R Schmitt
(74) *Attorney, Agent, or Firm* — Merchant & Gould P.C.

(57) ABSTRACT

A deformable sensor arrangement includes a deformable sensor attachable to a curved surface. The deformable sensor includes an elastic layer having a Young's modulus at least 0.01 MPa and a first yield strain at least 10%. A first stretchable electrode attaches to the elastic layer, and a stretchable electrically conductive wiring. The first stretchable electrode and the stretchable electrically conductive wiring stretch at least 5% without breaking. An electronic arrangement electrically couples to the first stretchable electrode via the stretchable electrically conductive wiring and obtains a first signal from the first stretchable electrode. An analyzer determines a calibrated value based on the obtained first signal and assembly compensation coefficients, which
(Continued)

are based on material compensation coefficients, and a measured signal of the deformable sensor in its installing position. A system and method are for installing the arrangement. A method and computer program determine a value of interest.

17 Claims, 8 Drawing Sheets

(51) Int. Cl.
<br>    *G01L 1/14*     (2006.01)
<br>    *G01L 1/18*     (2006.01)
<br>    *G01L 1/22*     (2006.01)
<br>    *H05K 1/09*     (2006.01)
<br>    *H05K 1/18*     (2006.01)
<br>    *H05K 3/32*     (2006.01)

(52) U.S. Cl.
<br>    CPC ............ *G01L 1/2287* (2013.01); *H05K 1/095* (2013.01); *H05K 1/189* (2013.01); *H05K 3/321* (2013.01); *H05K 3/326* (2013.01); *H05K 2201/10151* (2013.01)

(56) References Cited

FOREIGN PATENT DOCUMENTS

| | | |
|---|---|---|
| JP | 209020006 | 1/2009 |
| JP | 2009527765 | 7/2009 |
| JP | 2013185966 | 9/2013 |
| JP | 2019138741 | 8/2019 |
| JP | 2019522804 | 8/2019 |
| WO | 2019/022619 A1 | 1/2019 |
| WO | 2019/022619 A9 | 1/2019 |
| WO | 2019/138153 A1 | 7/2019 |

OTHER PUBLICATIONS

PCT Written Opinion PCT Application No. PCT/EP2020/074760 dated Nov. 26, 2020 (3 pages).
Response to PCT Written Opinion for PCT Application No. PCT/EP2020/074760 dated Mar. 26, 2021 (12 pages).
PCT International Preliminary Report on Patentability for PCT Application No. PCT/EP2020/074760 dated Dec. 10, 2021 (29 pages).
Extended European Search Report for EP Application No. 19397525.5 dated Mar. 27, 2020 (8 pages).
European Intention to Grant for EP Application No. 1939756.5 dated Oct. 26, 2021 (79 pages).
Office Action received in corresponding application dated Aug. 30, 2022, 8 pages.
Office Action with translation, received in corresponding application in Japan, dated Nov. 22, 2022, 9 pages.

\* cited by examiner

DEFORMABLE SENSOR

CROSS-REFERENCE TO RELATED APPLICATIONS

This application is a National Stage Application of PCT/EP2020/074760, filed 4 Sep. 2020, which claims benefit of Ser. No. 19397526.5, filed 6 Sep. 2019 in Europe, and which applications are incorporated herein by reference. To the extent appropriate, a claim of priority is made to each of the above disclosed applications.

TECHNICAL FIELD

The invention relates to deformable sensors. The invention relates to an arrangement comprising a deformable sensor. The invention relates to a method, system and computer program for determining a value of interest. The invention relates to an installation method for installing deformable sensors. The invention relates to a use of a deformable sensor.

BACKGROUND

Interest in well-being as well as safety and comfort has increased. This involves personal well-being as well as health care. This has resulted in many personal and medical monitoring devices having a human-machine interface (HMI).

The personal and the medical monitoring devices may have sensors. Such sensors can be embedded, for example, in clothing, furniture and vehicles. In such sensors there are several interrelated problems. For example, measurements of an electrode should not affect the measurement result of another electrode. Furthermore, it would be beneficial that multiple measurements could be measured in parallel, i.e. simultaneously or substantially simultaneously. Furthermore, the sensor should be installable. Still further, the sensor should be mechanically reliable, and, in some applications, comfortable to use and/or wear.

SUMMARY

It is an aim of the present invention to provide an improved deformable sensor arrangement. Further, an aim of the present invention is to provide a method, system, and computer program for determining a value of interest. Furthermore, an aim of the present invention is to provide an improved installation method.

A deformable sensor arrangement for the purpose is presented in independent claim 1 of the present application as filed. A method for comprising a deformable sensor is presented in independent claim 11 of the present application as filed. A system for determining a value of interest is presented in independent claim 12 of the present application as filed. Furthermore, an installation method for installing a deformable sensor arrangement is presented in independent claim 13 of the present application as filed. Still further, a use of a deformable sensor is presented in claim 14, and a computer program for determining a value of interest is presented in independent claim 15.

The deformable sensor comprises a layer or layers that is/are stretchable and elastic. The deformable sensor can further comprise stretchable electrodes attached to this layer or one of these layers. The stretchability improves the deformability of the deformable sensor.

The deformable sensor arrangement can comprise analyzing means configured to determine a calibrated value based on assembly compensation coefficients and a signal measured by the deformable sensor. The assembly compensation coefficients can be based on material compensation coefficients, and at least one measured signal in an installing position of the deformable sensor when no object to be measured has an effect on the deformable sensor.

The material compensation coefficients can include an effect of
  temperature, and/or
  moisture
on the measured signals of the deformable sensor.

Furthermore, the material compensation coefficients can include an effect of
  material(s) of the deformable sensor, and/or
  a structure of the deformable sensor
on the measured signals of the deformable sensor.

The novel solution can also be used to determine whether the installing surface in which the sensor is positioned is still in suitable condition. In this case, the analyzing means can be configured to obtain at least one signal from the electrode(s) when no object to be measured has an effect on the deformable sensor. Said signal(s) can be compared to at least one other signal stored to a memory, which said stored signal was obtained when the deformable sensor was installed to the current surface. Further, the difference between the measured signal and the stored signal can be used to determine whether the installing surface in which the sensor is positioned is still in suitable condition.

The deformable sensor, or at least most of the deformable sensor can be flexible, stretchable and conformable. The novel solution makes it possible to have reliable solution on a complex surface.

Thanks to the present invention, it is possible to use material compensation coefficients to obtain assembly compensation coefficients easily after an installation, even if the deformable sensor is installed on a non-planar surface, for example on a double curved surface. Thus, the installation process of the deformable sensor can be efficient and easy. Furthermore, thanks to the novel deformable sensor, values of interest can be reliable measured.

BRIEF DESCRIPTION OF THE DRAWINGS

In the following, the present invention will be described in more detail with reference to the appended drawings, in which.

4*a-b* illustrate examples of operating principles of a system comprising the deformable sensor.

Figure 1A:
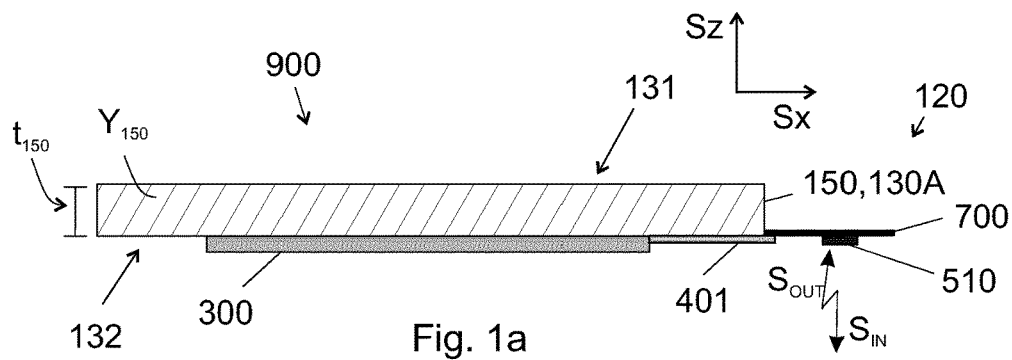
FIGS. 1*a-f* show, in a side view, a part of a deformable sensor arrangement.

In the figures, the direction Sz indicates a direction of a thickness of the deformable sensor structure. The directions Sx and Sy are perpendicular to each other and to Sz. The figures illustrate the sensor in substantially planar form but, since the sensor is deformable, it may be shaped to another form. Therefore, the directions Sx, Sy, and Sz may depend on location, when the sensor is not planar.

DETAILED DESCRIPTION

The following reference numbers are used in this application:
- 100 deformable sensor,
- 120 electronic arrangement,
- 130A first elastic, deformable layer,
- 130B second elastic, deformable layer,
- 131 first side of the first elastic deformable layer,
- 132 second side of the first elastic deformable layer,
- 133 first side of the second elastic deformable layer,
- 134 second side of the second elastic deformable layer,
- 140 first electrically permeable and/or conductive layer,
- 142 second electrically permeable and/or conductive layer,
- 150 elastic and stretchable layer,
- 181 material compensation coefficients,
- 182 assembly compensation coefficients,
- 183 third reference values, third curve,
- 200 a flexible and stretchable layer,
- 226 first joint,
- 227 second joint,
- 232 first interface,
- 234 second interface,
- 250 reinforcement structure,
- 300 stretchable electrodes,
- 301 first stretchable electrode,
- 302 second stretchable electrode,
- 300, 301, 302, 304, 311, 315, 316, 321, 322 stretchable electrode,
- 400 electrically conductive wiring,
- 401 first electrically conductive wire,
- 402 second electrically conductive wire,
- 400, 401, 402, 404 electrically conductive wire,
- 490 electrically conductive connection,
- 500 external unit, such as an external control unit or a cloud service unit,
- 510 electronic chip, such as a microchip,
- 550 external control unit,
- 570 cloud service unit, and
- 700 circuit board, e.g. flexible circuit board.

In this application "a sensor" refers to a device which produce an electrical signal corresponding to changes in inputs. The sensor may be activated, for example, by a touch.

In this application, the term "deformable sensor" refers to a sensor, which can be attached to a curved object and shaped according to the surface of the object. The deformable sensor is typically attachable, for example, to a curved surface and to a double curved surface, i.e., to a surface that curves in two directions. Thus, the deformable sensor may be shaped according to the intended application.

The deformable sensor can be conformable. The term "conformable" refers to material that is at least flexible and stretchable and preferably also compressible.

In this application, the term "flexible" means that a planar flexible material or a planar flexible structure can be bent to a radius of curvature, which said radius of curvature is 5 times a thickness of said flexible material, without breaking the material at a temperature of 20° C. Moreover, the flexible material can be thereafter turned back to the planar form at a temperature of 20° C. without breaking the material; or it may spontaneously turn back to planar form without breaking.

In this application, the term "stretchable" means that the stretchable material or object can be stretched, at a temperature of 20° C., at least 5% without breaking, preferably at least 10% in a reversible manner without breaking. In particular, a layer of stretchable material can be stretched, at a temperature of 20° C., by at least 5%, preferably at least 10% in a reversible manner a direction that is perpendicular to the direction of thickness of the layer. The reversibility of the stretching is spontaneous, i.e. elastic.

In this application the term "compressible" means that the compressible material (or the compressible layer or another object) can be compressed, at a temperature of 20° C., by at least 10% in a reversible manner. In particular, a compressible material can be compressed by at least 10% in a reversible manner in the direction of thickness of the layer. The reversibility of the compression is spontaneous, i.e. elastic. A Young's modulus of a compressible layer can be less than 1 GPa.

In this application the term "material compensation coefficients 181" refers to calibration coefficients that can be used to characterize materials and/or a structure of the deformable sensor. The material compensation coefficients typically include an effect of temperature and/or moisture on the measured signals of the deformable sensor. The material compensation coefficients can be used to obtain calibrated values from signals of the deformable sensor on a planar surface. Preferably, the material compensation coefficients are used to form assembly compensation coefficients, which assembly compensation coefficients can be used to obtain calibrated values from signals of the deformable sensor, not only on a planar surface, but also on a non-planar surface. The material compensation coefficients can be stored to memory of the deformable sensor arrangement, for example, during a manufacturing process of the deformable sensor. In an embodiment, the material compensation coefficients are formed or calibrated after the manufacturing process of the deformable sensor. Thus, the term "material compensation coefficients" can also refer to material compensation coefficients which are formed and/or calibrated after the manufacturing process of the deformable sensor.

In this application the term "assembly compensation coefficients 182" refers to calibration coefficients that can be used to calibrate a measured signal. The assembly compensation coefficients typically use the material compensation coefficients to obtain reliable data. Thus, a calibration process of the deformable sensor does not need to be done on different temperatures and/or moistures etc., because the effect of those on the signals is typically within the material compensation coefficients. Thus, thanks to the novel solution, the calibration process of the deformable sensor to obtain the assembly compensation coefficients can be done within a second. Furthermore, thanks to the novel deformable sensor, values of interest can be reliable measured after the fast calibration process.

The deformable sensor is preferably conformable and/or comprises at least one conformable layer, more preferably at least two conformable layers; at least one conformable layer as a substrate and at least one conformable layer for an electrode and/or wiring. Thus, the deformable sensor can be easily installed to a curved surface.

A planar conformable layer is flexible as indicated above and stretchable in a direction of the plane of the planar conformable layer; and preferably also compressible in the direction of its thickness as detailed above. A planar conformable layer can typically be arranged to conform a surface of a hemisphere of a sphere having a radius of 10 cm (or less) at a temperature of 20° C. without breaking. Typically, a planar conformable layer can be arranged to conform a surface of a hemisphere having a radius of 10 cm (or less) at a temperature of 20° C. without introducing significant plastic (i.e. irreversible) deformations to the material. Herein the term "significant" means that, when arranged on the hemisphere, the elastic strain of the conformable material is greater than the plastic strain thereof.

Figure 4A:
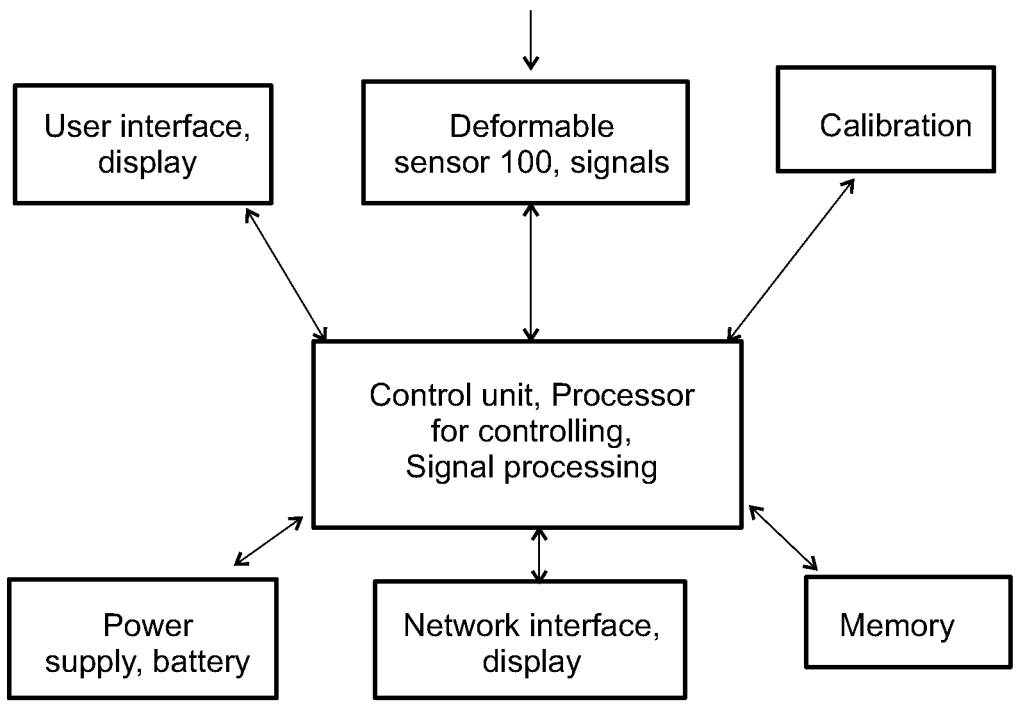
Figure 4B:
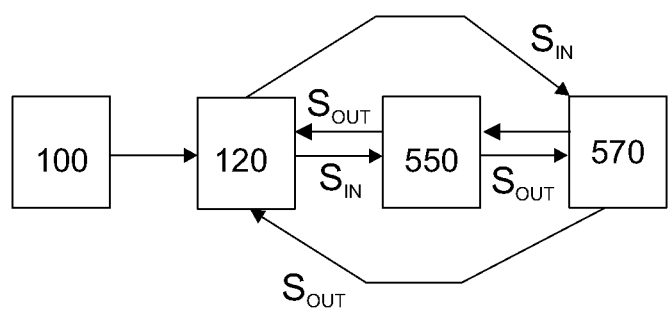
Figure 5A:
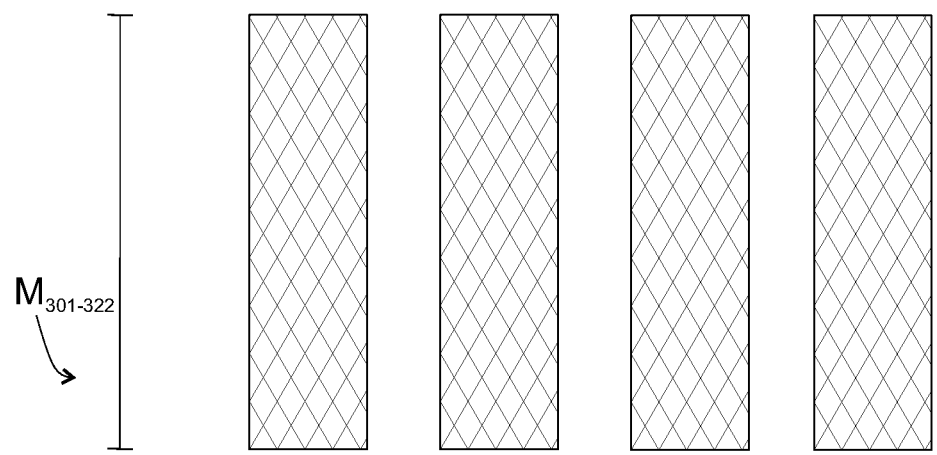
FIG. 5*a* illustrates examples of measurement ranges on a planar surface.
Figure 5B:
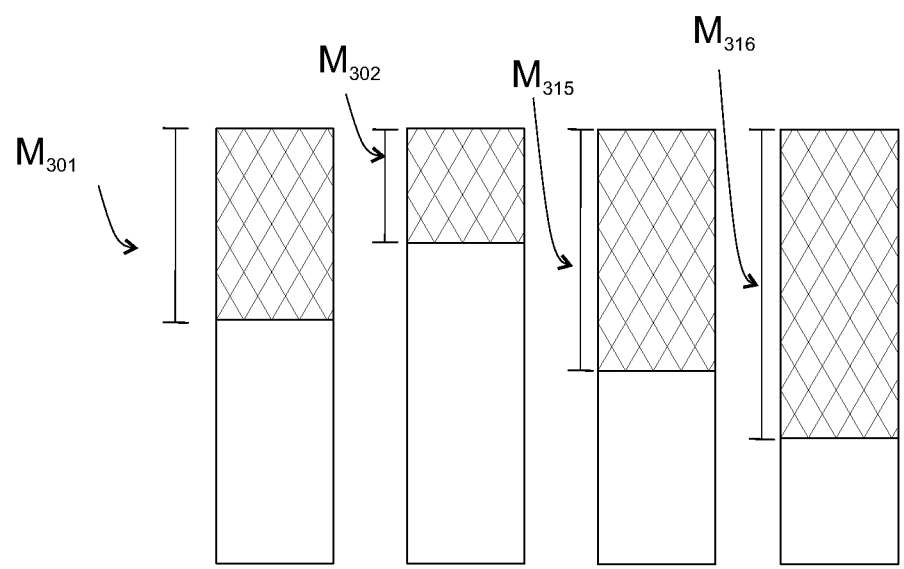
FIG. 5*b* illustrates examples of measurement ranges on a non-planar surface after conformable installation, if the deformable sensor is not reliable calibrated.
Figure 7A:
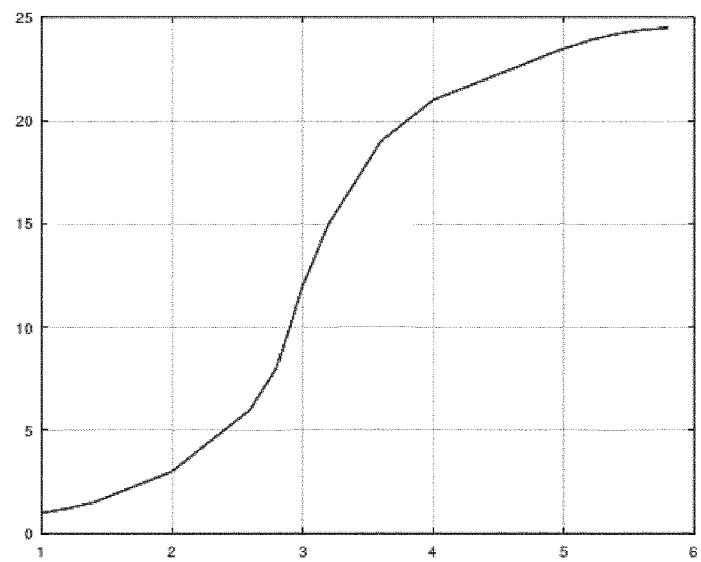
FIG. 7a illustrates an example of uncalibrated measurements.
Figure 7B:
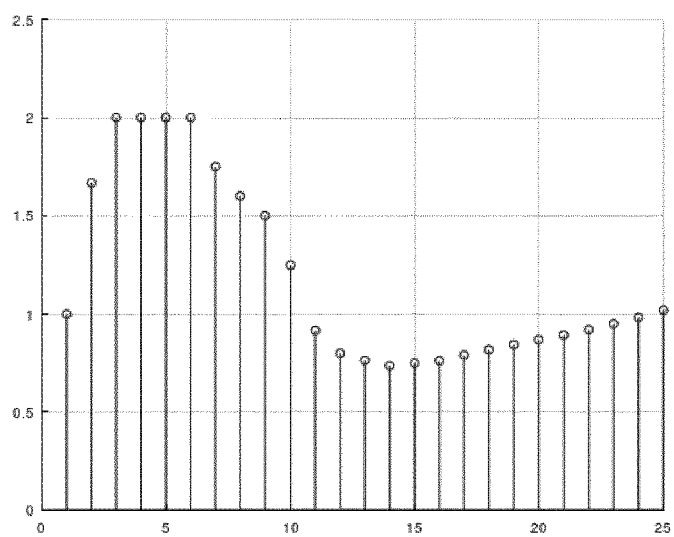
FIG. 7b illustrates an example of material compensation coefficients.
Figure 7C:
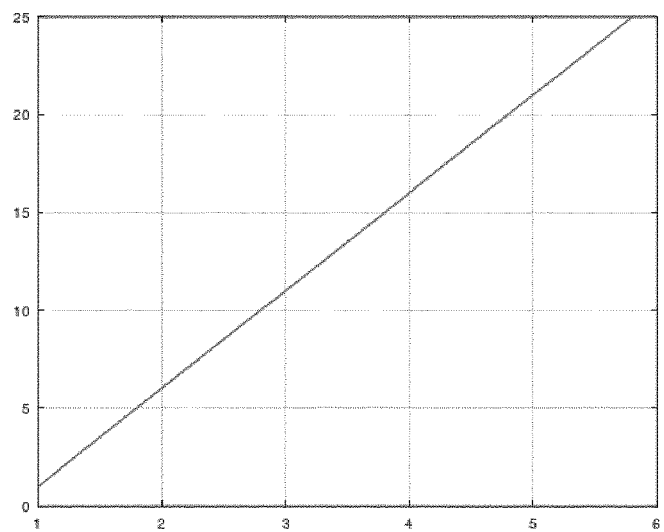
FIG. 7c illustrates an example of calibrated measurements on a planar surface.
Figure 8A:
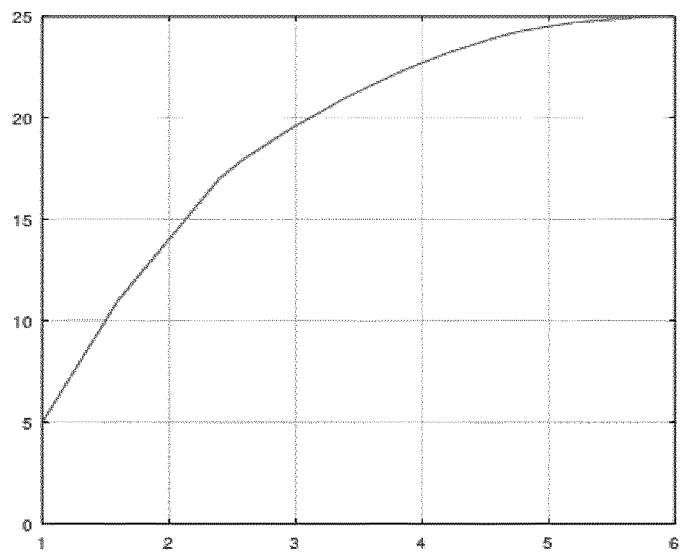
FIG. 8a illustrates an example of measurements after installation on a non-planar surface, before a calibration.
Figure 8B:
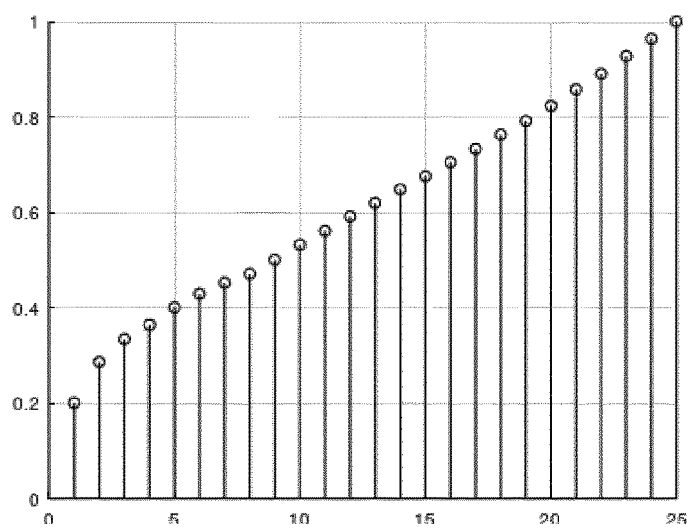
FIG. 8b illustrates an example of assembly compensation coefficients.
Figure 8C:
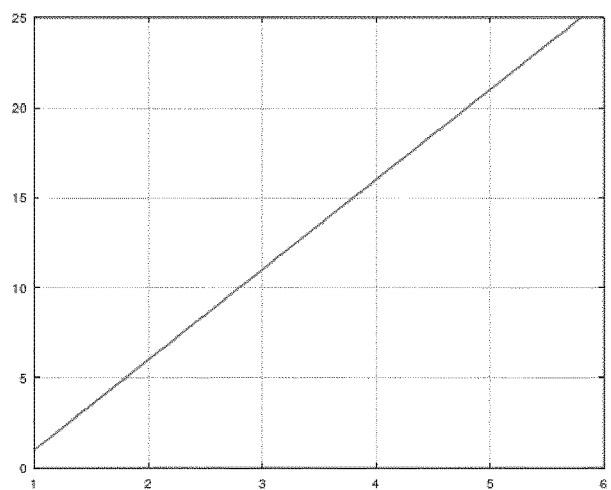
FIG. 8c illustrates an example of measurements after assembly compensation.

FIGS. 1a-f, 2a-b and 3a-b disclose a deformable sensor, or a part of the deformable sensor. FIGS. 4a-b disclose operating principles of a system comprising the deformable sensor. FIGS. 5a-b disclose examples of measurement areas of electrodes on a planar surface (FIG. 5a) and on non-planar surface (FIG. 5b). FIGS. 6a-8c disclose some examples of coefficients and measurements. FIGS. 7a and 8a illustrate some examples of uncalibrated measurements, FIGS. 7b and 8b illustrate some examples of coefficients, and FIGS. 7c and 8c illustrate some examples after a calibration of the deformable sensor.

The deformable sensor can be against and/or attached to a second surface, i.e., in its installing position. The deformable sensor 100 may be secured in its installing position removably or permanently with a mechanical support. In addition, or alternatively, the securing can be provided by using an adhesive.

Thanks to the novel solution, the deformable sensor having material compensation coefficients on its memory can be installable to many different kinds of surfaces. Thus, if the deformable sensor is removably attached to a first surface, the deformable sensor 100 can be reinstalled to another object, even if said another object has a differently shaped surface. Thus, the deformable sensor can be re-installable, for example, from a curved surface to a double curved surface. In this case, the deformable sensor 100 is preferably installed with a mechanical support, without permanent adhesive(s).

The deformable sensor 100 typically comprises
  at least one elastic layer 130A, 130B, 150, such as an elastic deformable layer,
  at least one stretchable electrode 300, and
  electrically conductive wiring 400.

The deformable sensor 100 can comprise a first electrode 301 coupled to a first electrically conductive wire 401. The electrode 300 may form a part of the wiring 400.

The wiring 400, in particular the first wire 401 thereof, is preferably flexible and stretchable in the meaning discussed above for these terms. Preferably, also the first electrode 301 is flexible and stretchable in the meaning discussed above for these terms. The wiring 400 may be arranged as a part of an electrically conductive multilayer structure.

The deformable sensor 100 can be used in such environments, wherein their shape is subject to change. In addition, or alternatively, the deformable sensor can be used on complex surface, such as on a double curved surface.

The wiring 400, i.e., the wire(s) 401,401,403 can be manufactured e.g. by using such additive manufacturing techniques that produce stretchable conductive wirings, such as printing. In the alternative, the wiring 400 can be laminated onto a layer of material. The wiring 400 can be manufactured (e.g. printed or laminated) onto a flexible and stretchable layer 200. In the alternative, the wiring 400 may be manufactured (e.g. printed or laminated) onto another layer, such as an elastic layer 130A, 130B, 150.

To obtain reliable electric sensor, the elastic layer(s) 130A, 130B, 150, and/or the flexible and stretchable layer(s) 200 are preferably electrically insulating. At least in the case of a capacitive operational principle, the flexible and stretchable layer 200 is preferably electrically insulating.

The deformable sensor comprises an electronic arrangement 120. The electronic arrangement 120 can comprise a joint 226, which can be connected to the first wire 401, and via the first wire 401 to a first electrode 301. It has been noticed that the stretchability of the first wire 401 can be utilized to improve the reliability of the deformable sensor 100. In particular, since the first wire 401 is stretchable, its ability to stretch may be utilized to improve reliability. This property can be utilized such that, in use, a part of the first wire 401 takes in most of the mechanical deformations. This can be achieved by material design in such a way that near a joint 226 (shown in FIGS. 3a-b) the sensor 100, at least except for the possible reinforcement structure 250, deforms in-plane more easily than farther away from the joint 226. Even if not shown, such a joint 226 can be present in also other embodiments.

In an embodiment, the electronic arrangement comprises a circuit board 700, such as a flexible circuit board. The circuit board 700 of the electronic arrangement 120 can be connected to the first electrically conductive wire 401 using suitable joining technique, such as crimp connection or conductive adhesive, such as anisotropic conductive adhesive (ACF). In such a case, the conductive adhesive may form the first joint 226 or a part thereof. Conductive adhesives have been found to form reliable joints.

Figure 3A:
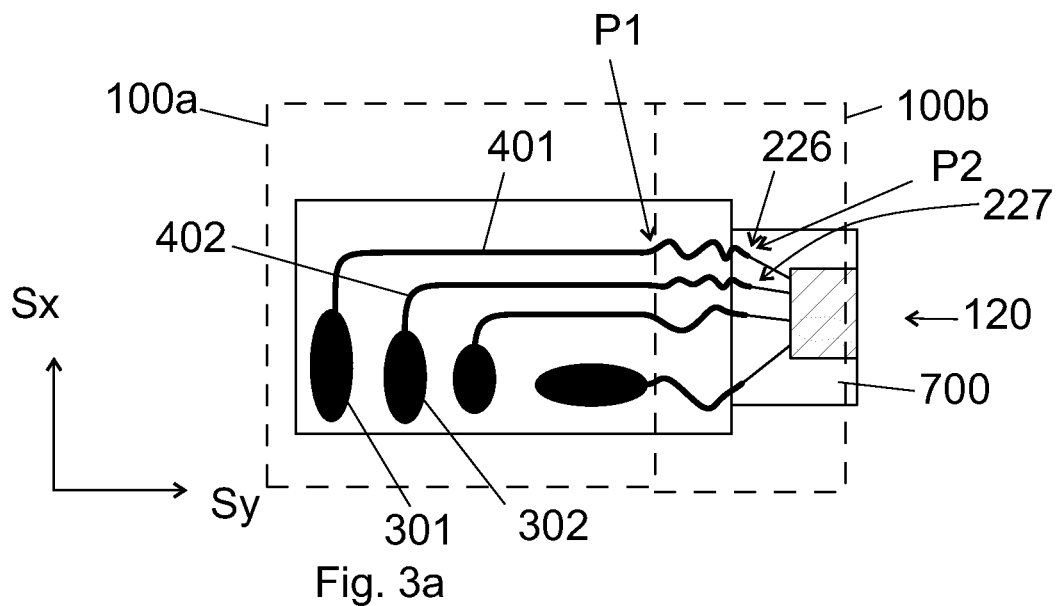
FIG. 3*a* shows, in a top view, a part of a deformable sensor arrangement.
Figure 3B:
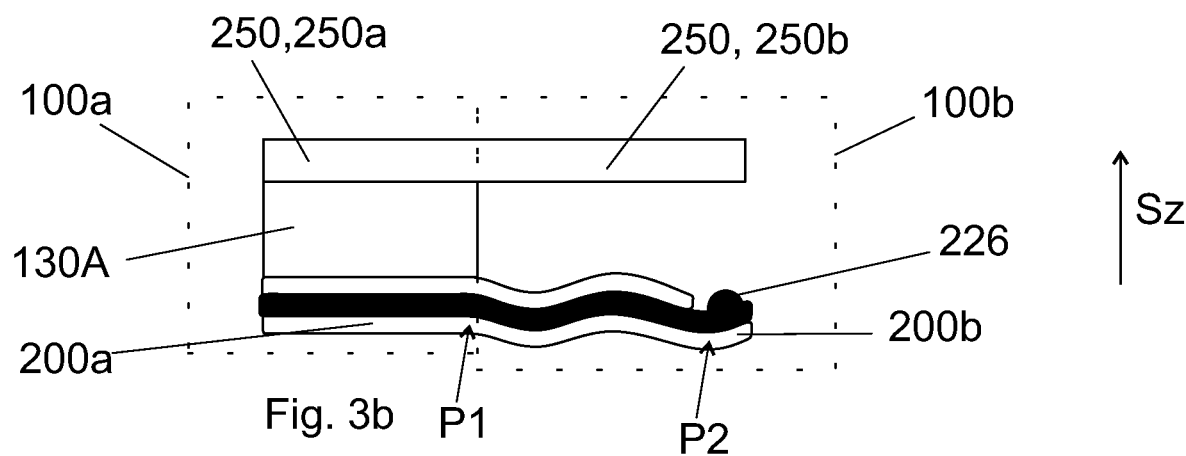
FIG. 3*b* shows, in a side view, a part of a deformable sensor arrangement.

The deformable sensor 100 can have a first part 100a of the deformable sensor 100 and a second part 100b of the deformable sensor 100 (See FIGS. 3a-b). The division is to be understood as a mental process of defining such parts; the physical sensor 100 is not physically divided. Thus, the sensor can be dividable to the parts 100a, 100b. Such a division of the sensor 100 is shown e.g. in FIGS. 3a and 3b by the dotted rectangles. The first part 100a extends through the sensor 100 in the direction Sz of thickness of the sensor 100. The second part 100b extends through the sensor 100 in the direction Sz of thickness of the sensor. Furthermore, the sensor can be divided to more than two parts.

The first electrically conductive wire 401 can be attached to a first joint 226 for connecting the first wire 401 to the electronic arrangement 120. The first wire can be connected, for example, to the circuit board 700 and/or to the electronic chip 510 of the electronic arrangement 120. This can improve the reliability of the connection to the electronic arrangement 120.

Moreover, the first electrically conductive wire 401 can extend from the first joint 226 via the second part 100b of the sensor 100 to the first part 100a of the sensor 100 and further to the first electrode 301. Thus, it can be possible to use the first joint 226, the first wire 401 and the first electrode 301 for measurements. The first joint 226 may be arranged within the second part 100b of the sensor 100. Alternatively, the first joint 226 may be arranged outside the first and the second parts 100a, 100b.

The deformable sensor 100 can comprise a flexible and stretchable protective layer. The protective layer may protect at least a part of the wiring 400. Moreover, in other parts, the protective layer can be attached to another layer. In an embodiment, the wiring 400 can be arranged in between the substrate layer 200, 150, 130A, 130B, and flexible and stretchable protective layer.

In an embodiment (shown in FIGS. 1e-f), at least a part of the first wire 401 is arranged in between a flexible and/or elastic layer 200, 130A, 130B, 150 and a flexible and stretchable protective layer 150, 130A, 130B, 250. Being so arranged, at such locations that the wiring 401 does not exists, the protective layer forms a first interface 232 with the flexible and stretchable substrate 200. Correspondingly, at such locations that the wiring 401 exists, the protective layer 150, 130A, 130B, 250 forms a second interface 234 with the first wire 401. Having the protective layer 150, 130A, 130B, 250 such that it forms the interface 234 with the first wire 401 further improves the reliability of the structure.

The flexible and stretchable protective layer 150, 130A, 130B, 250 can be the elastic deformable layer 150, 130A, 130B or a reinforcement structure 250. Thus, the flexible and stretchable protective layer can be the reinforcement structure 250, 250a, 250b (See FIG. 3b). A function of the reinforcement structure 250 is to reinforce the sensor 100 at least near a connection of the first wire 401 to other electronics of the sensor 100. In order to properly reinforce, the reinforcement structure 250 is preferably integral, i.e. not constituted from separate parts.

The first electrically conductive wire 401 and the flexible and/or elastic layer 200, 130A, 130B, 150, are preferably arranged on a same side of the reinforcement structure 250, if the reinforcement structure 250 is used.

In the case of the reinforcing structure 250, it has been noticed that the reliability can be further improved by attaching, within the first part 100a of the sensor 100, the first wire 401, optionally via other layer(s), to the reinforcement structure 250 in the direction Sz of thickness of the sensor. By attaching the first part 401 of the wire to the reinforcing structure 250, the reinforcing structure 250 strengthens the structure for improved reliability.

Furthermore, the reliability can be improved by not attaching, within the second part 100b of the sensor 100, the second part 400b of the wire 400 to the second part 250b of the reinforcing structure 250 in the direction Sz of thickness of the sensor 100; neither directly, nor via other layer(s). By not attaching (within the second part 100b) the wire 400 to the reinforcement structure 250, the wire 400 is configured to move freely with respect to the reinforcement structure 250, which allows for the wire 400 to take in the mechanical strain.

The function of the wiring 400 is to couple the stretchable electrode(s) 300, 301, 302 to the electronic arrangements 120. Therefore, the joint 226, 227, if used, is preferably suitable for joining the wire 401 to other electronics. For example, a first joint 226 (shown in FIGS. 3a-b) can be joined to the first wire 401.

The reliability of the deformable sensor 100 near the first joint 226 can be further improved by making the first wire 401 to meander near the first joint 226. Therefore, the first electrically conductive wire 401 can meander. A meandering wire takes in mechanical stress even more effectively than a straight wire, even if stretchable. In an embodiment, the first wire 401 meanders, at least within the second part 100b of the deformable sensor 100.

Thus, the first electrically conductive wire 401 can meander such that the first electrically conductive wire extends from a first point P1 to a second point P2 in such a manner that a distance between these points (P1, P2), as measured along the first electrically conductive wire 222, is greater, preferably at least 5% greater, than the distance between these points (P1, P2) measured straight. Preferably, the first electrically conductive wire 401 meanders within the second part 100b such that the first electrically conductive wire extends from a first point P1 to a second point P2 in such a manner that a distance between these points (P1, P2), as measured along the first electrically conductive wire 222, is at least 5% greater than the distance between these points (P1, P2) measured straight. The second point P2 may be located at the first joint 226. The first point P1 may be located at the common edge 100ab of the first part 100a and the second part 100b of the sensor 100.

The first electrically conductive wire 400, 401 can meander on the substrate, e.g. between two layers. The substrate needs not to meander, but it may meander. Thus, the wire 401,402 may meander (at least) in a tangential plane of the substrate. In addition, or alternatively, at least one layer of the deformable sensor 100, such as the multilayer conductor structure, may meander in the direction Sz of thickness, as indicated in FIG. 3b. It has been noticed that the meandering particularly in the direction Sz of thickness of the sensor improves reliability, since a wire that meanders in the Sz direction is extremely resilient in the in-plane direction (i.e. perpendicular to Sz).

The deformable sensor 100 can comprise a second electrically conductive wire 402. Preferably the second electrode 302 is also flexible and stretchable in the meaning discussed for these terms. The second electrically conductive wire 402 can be attached to a second joint 227 for connecting the second wire 402 to the electronic arrangement 120.

The first stretchable electrode 301 and/or the second stretchable electrode 302 can be attached to the flexible and stretchable layer 200. Alternatively, the first stretchable electrode 301 and/or the second stretchable electrode 302 can be attached to the elastic layer 130A, 130B, 150. The individual stretchable electrodes are referred to by the references 301, 302, 303, . . . ; while the stretchable electrodes in general are referred to by the reference 300. The stretchable electrode(s) 300 is/are electrically conductive electrode(s).

Throughout this description, the term "electrically conductive", referring to the electrically conductive structure, layer, electrode, wiring and material, refers to a resistivity (i.e. specific electrical resistance) of less than 10 Ωm, more preferably less than 5 Ωm at the temperature of 20° C. Preferably, an electrically conductive material as well as an electrically conductive layer has a resistivity of at most 1 Ωm, measured at a temperature of 20° C. and at an internal elastic strain of 0%; i.e. without compression or tension, i.e. at rest.

The deformable sensor 100 can comprise a second electrode 302. If the deformable sensor 100 comprises the second electrode 302, the second electrode can be arranged a distance apart from the first electrode 301. As an example, the second electrode 302 may be arranged at least 0.5 mm apart from the first electrode 301. The deformable sensor can comprise, for example, from 1 to 100 electrodes, or from 10 to 50 electrodes. The preferable number of electrodes depend, for example, on a structure of the deformable sensor, and an installation surface of the deformable sensor.

Figure 2A:
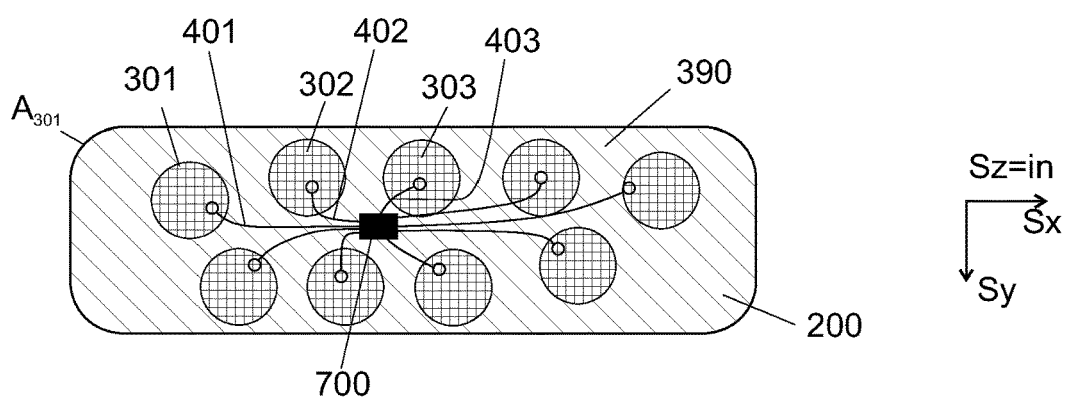
FIGS. 2*a-b* show, in a top view, a part of a deformable sensor arrangement.
Figure 2B:
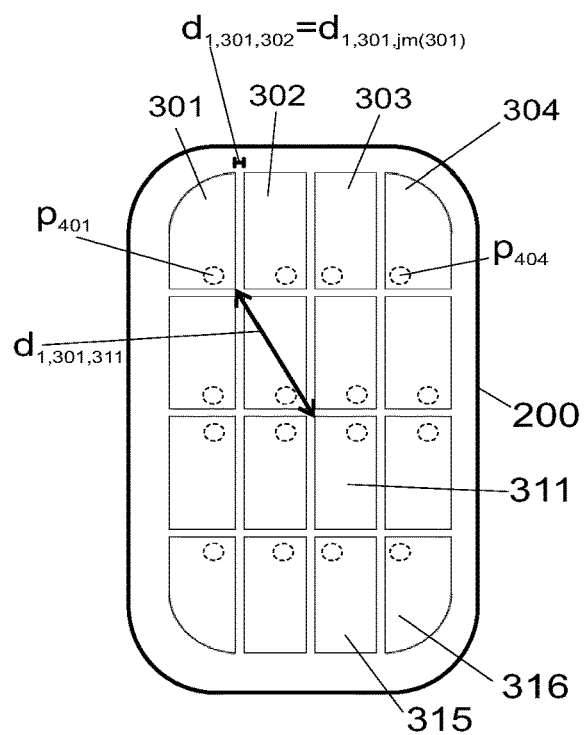

Thus, in order to electrically insulate the stretchable electrodes 300 from each other, the first stretchable electrode 301 can be arranged a distance $d_1$ apart from the second stretchable electrode 302 (see FIG. 2b). As is conventional, a distance $d_1$ between first and second electrodes and a distance $d_{1,i,j}$ between electrodes i and j refer to the distance between closest points of the two electrodes, i.e. the smallest distance in between the two electrodes. Each stretchable electrode i (301, 302, 303, . . . , 315, 316) can be located a distance apart from each other stretchable electrode j (316, 301, 302, 303, . . . , 315).

In a preferred embodiment, each two closest electrodes are reasonably close to each other. More specifically, in an embodiment, the maximum of $d_{1,i,jm(i)}$ is at most 15 mm, preferably at most 10 mm, and most preferably equal or less than 5 mm. The maximum can be found by considering each electrode i subsequently. This ensures that most of a surface having the electrodes is covered by electrodes, which may improve the accuracy of measurements.

In FIG. 2b only the distances $d_{1,301,302}$ and $d_{1,301,311}$ are shown. In an advantageous embodiment, the minimum of the distances $d_{1,i,j}$ is at least 1 mm, preferably at least 2 mm. Such a minimum distance improves the separation of the stretchable electrodes. As a result, disturbances during measurements can be diminished. In an embodiment, the improved separation can result in less capacitive coupling between the electrodes.

The deformable sensor 100 can comprise at least fifteen stretchable electrodes 300 attached to a layer 150, 130A, 130B, 200, preferably to the flexible and stretchable layer 200. This may improve the accuracy of measurements.

As for the stretchability of the stretchable electrodes 300, the stretchable electrodes 300 have a second yield strain $\varepsilon_{y,300}$ that is, in an embodiment, at least 10 percent. This value has been found to be sufficiently high for a deformable sensor in many applications. This value has been found to be sufficiently high from the point of view of mechanical reliability of the stretchable electrodes 300, since typical deformations are less than this value. In the alternative, the second yield strain $\varepsilon_{y,300}$ may be at least 20 percent or at least 30 percent. Therefore, the electrode 300 can be used with a deformable sensor that will be installed on a difficult kind of installation surface. In the alternative, the second yield strain $\varepsilon_{y,300}$ may be at least 30 percent Therefore, the electrode 300 can be used with a deformable sensor that will be installed on a very difficult kind of installation surface The flexible and stretchable layer 200 has preferably a reasonably large first yield strain $\varepsilon_{y,200}$. In an embodiment, the first yield strain $\varepsilon_{y,200}$ is at least 10 percent. This value has been found to be sufficiently high for the deformable sensor in many applications. This value has been found to be sufficiently high also from the point of view of mechanical reliability of the flexible and stretchable layer 200, since typical deformations are less than this value. In the alternative, the first yield strain $\varepsilon_{y,200}$ may be at least 20 percent. Therefore, the flexible and stretchable layer can be used with a deformable sensor that will be installed on a difficult kind of installation surface. In the alternative, the first yield strain $\varepsilon_{y,200}$ may be at least 30 percent. Therefore, the flexible and stretchable layer can be used with a deformable sensor that will be installed on a very difficult kind of installation surface.

Typically, the second yield strain $\varepsilon_{y,300}$ of the stretchable electrodes 300 is less than the first yield strain $\varepsilon_{y,200}$ of the flexible and stretchable layer 200.

In addition, the flexible and stretchable layer 200 is preferably electrically insulating. Throughout this description, the term "electrically insulating", referring to a material, surface, structure or layer, refers to a resistivity (i.e. specific electrical resistance) of more than 100 Ωm at the temperature of 20° C.

The stretchable electrode 300 can be configured to detect changes in an area substantially the same as the area of the electrode. Thus, the effective area from which such a stretchable electrode is configured to measure, can be equal or substantially equal to the area of the stretchable electrode 301 itself. Herein the area refers to the area of the cross section of the stretchable electrode onto a plane having a surface normal that is parallel to the direction of thickness of the sensor 100.

At least one stretchable electrode 300, preferably all stretchable electrodes 300 of the deformable sensor 100, can be made from conductive ink, hence, the stretchable electrode(s) can be reasonably homogeneous.

In an embodiment, at least one stretchable electrode 300, preferably all stretchable electrodes 300, is/are made from electrically conductive fabric or fibres. Conductive ink, as well as conductive fabric, typically comprises electrically conductive particles, such as flakes or nanoparticles, attached to each other. Thus, in an embodiment, at least the first stretchable electrode 301, preferably all electrodes 300, comprise(s) electrically conductive particles, such as flakes or nanoparticles, attached to each other in an electrically conductive manner. In a preferable embodiment, the electrically conductive particles comprise at least one of carbon (including, but not limited to graphene and carbon nanotubes), copper, silver, and gold. In an embodiment, the first electrode 301 comprises electrically conductive polymer-based material, preferably at least one of polyaniline, a polyvinyl (e.g. polyvinyl alcohol or polyvinyl chloride), and PEDOT:PSS (i.e. poly(3,4-ethylenedioxythiophene) polystyrene sulfonate).

The stretchable electrode(s) 300 can be e.g. sewed to on otherwise non-conductive layer, such as a flexible and stretchable layer 200, e.g. textile layer. Thus, the stretchable electrode 300 may be made as a mesh of conductive yarns, such as metal-coated polyamide or polyester. It is noted that also such a stretchable electrode is configured to detect the changes, such as capacitance, in an area that is substantially the same as the area limited by the outer edge of the stretchable electrode. Thus, the effective area from which such a stretchable electrode is configured to measure, can be equal to the area limited by the outer edge of the stretchable electrode 301; even if the area of the conductive yarns may be less. As an alternative to sewing, an electrode having the shape of a mesh can be printed with conductive ink. As evident, in both types of electrodes, the effective area of the stretchable electrode is typically equal to the area limited by the outer edge of the stretchable electrode 301.

What has been said about the material of the first electrode 301 applies, in an embodiment, to all electrodes including the second electrode 302. What has been said about the material of the first electrode 301 applies, in an embodiment, to the first wire 401. What has been said about the material of the first electrode 301 applies, in an embodiment, to the second wire 402, and preferably to all wires 400.

The first electrode 301 is preferably able to stretch at least 5% without breaking. In addition, the first wire 401 is preferably able to stretch at least 5% without breaking. Thus, the deformable sensor having said electrode and wire can be installable on a curved surface, i.e., the first electrode and the first wire are not breaking on the curved surface. In addition, the second electrode 302 and the second wire 402, as well as all other electrodes and wires, are preferably able to stretch at least 5% without breaking. Thus, the deformable sensor can be installable on a double curved surface, i.e., said electrodes and wires are not breaking on the double curved surface.

Wires 400 can be connected to the electrodes 300 by using conductive adhesive(s). Thus, the wires can be connected to the electrodes in a reliable way. Circles shown on the electrodes in FIG. 2b indicate examples of locations for wires 400, 401, 402, 404, particularly if the wires 400, 401, 402, 404 are connected to the electrodes 300 by using the conductive adhesive(s).

As an alternative to the conductive adhesive, wires 400 may be arranged (e.g. printed) directly on the same substrate as the electrodes. By printing the wires, the deformable sensor arrangement may be efficiently manufactured.

As discussed above, at least a part of the wiring 400 can be arranged in between the flexible and stretchable layer 200 and the elastic and deformable layer 130A, 130B, 150. Furthermore, some adhesive may also be arranged in between the flexible and stretchable layer 200 and the elastic and deformable layer 130A, 130B, 150 in order to join the layers together.

In an embodiment, wiring for the electrodes is arranged on a flexible foil. In an embodiment, the deformable sensor 100 comprises a flexible foil having a fourth Young's modulus; and electrically conductive wiring 400 attached to the flexible foil. The first Young's modulus of the flexible and stretchable layer 200 can be less than the fourth Young's modulus. In this way, the flexible foil resists deformations more than the flexible and stretchable layer 200. However, the flexible foil is not necessary (nor always advantageous) for the deformable sensor.

The wiring 400 comprises at least one wire 401, more preferably at least 5 wires and most preferably at least ten wires 401, 402, 403. The wires 401, 402, 403 are preferably electrically insulated from each other. Moreover, the wiring is preferably coupled in an electrically conductive manner to the stretchable electrode(s) 300.

Therefore, at least a part of the electrically conductive wiring 400 can be coupled to the first stretchable electrode 301 in an electrically conductive manner; and at least a part of the electrically conductive wiring 400 can be coupled to the second stretchable electrode 302 in an electrically conductive manner.

Preferably, one wire 401, 402, 403 is coupled in an electrically conductive manner to only one stretchable electrode 301,302. This is to improve the spatial resolution of the sensor, i.e. each stretchable electrode can be used to measure, for example a force or pressure, at the location of substantially only the stretchable electrode.

In an embodiment, at least a part of the electrically conductive wiring 400, such as the wire 401, is coupled to the first stretchable electrode 301 with an electrically conductive connection 490. In an embodiment, at least a part of the electrically conductive wiring 400, such as the wire 402, is coupled to the second stretchable electrode 302 with an electrically conductive connection 490 (shown in FIG. 1c). In this way, the sensor 100 comprises connections 490 in between the wiring 400 and the stretchable electrodes 300. The connections 490 are electrically conductive. The connections 490 (See FIG. 1c) can be made such that the electrical resistivity of the connection is at most 10Ω. In addition, or alternatively, the material of the connection 490 may be electrically conductive in the aforementioned sense.

In an embodiment, the connection 490 (See FIG. 1c) between the first wire and the first electrode is made from electrically conductive adhesive, e.g. the connection 490 comprises cured electrically conductive adhesive. Such adhesives include isotropically conductive adhesives and anisotropically conductive adhesives. The connection 490 may be formed using conductive tape, such as an anisotropically conductive adhesive.

Conductive adhesives typically comprise
nickel, and/or
graphite, and/or
silver particles, and/or
gold,
mixed in a matrix material.

The conductive adhesive can comprise, for example, gold coated nickel particles mixed in a matrix material.

Said matrix material may be a cured polymer that is formed by polymerization of a resin of the adhesive during curing thereof. The resin may be thermosetting, e.g. an epoxy. Furthermore, the connections 490 may be galvanic, whereby a connection may comprise some solder, wherein the solder may comprise tin. Commonly available solders include tin-lead, tin-copper-silver, and tin-zinc-copper solder alloys.

The first wire 401 connects the first electrode 301 to the electronic arrangement 120. The first electrode 301 is preferably arranged onto the flexible and stretchable layer 200. Alternatively, it can be arranged, for example, onto the elastic layer 130A, 130B, 150.

The deformable sensor 100 can comprise insulating layer(s) and electrically permeable and/or conductive layer(s) 140, 142. The different layers may be attached to each other with adhesive as known per se. However, for clarity, adhesive is not shown in the figures.

The deformable sensor 100 comprises at least one insulating layer. The elastic, deformable layer 130A, 130B, as well as the flexible and stretchable layer 200 can be the insulating layer(s). The deformable sensor 100 can comprise a first layer 130A,150 and a second layer 130B, 200, the first layer and the second layer being insulating layers which are arranged such that the electrode layer 300 is arranged in between the first and second insulating layers in the direction of thickness of the thickness of the sensor structure 100 (shown in FIG. 1e). Furthermore, the deformable sensor may comprise a third insulation layer. Electrical contacts to the electrodes in use might cause malfunction of the sensor arrangement. Thus, a purpose of the insulating layer can be to electrically insulate the electrode(s) 301, 302 from environment. In an embodiment, a purpose of the of the insulating layer is to electrically insulate the electrode(s) 301, 302, in order to form a capacitance in between the first electrode 301 and the top of the elastic and deformable layer, such as a conductive layer on the elastic and deformable layer.

As for suitable materials for the insulating layers, a purpose of the insulating layers is to electrically insulate. Therefore, a resistivity of a material of the insulating layer(s), for example the flexible and stretchable layer 200, and a material of other insulating layer(s) (if present) may be at least 10 Ωm, more preferably at least 50 Ωm at a temperature of 20° C. Preferably, a resistivity of the flexible and stretchable layer 200 and/or other insulating layer(s) is at least 100 Ωm at a temperature of 20° C.

Figure 1B:
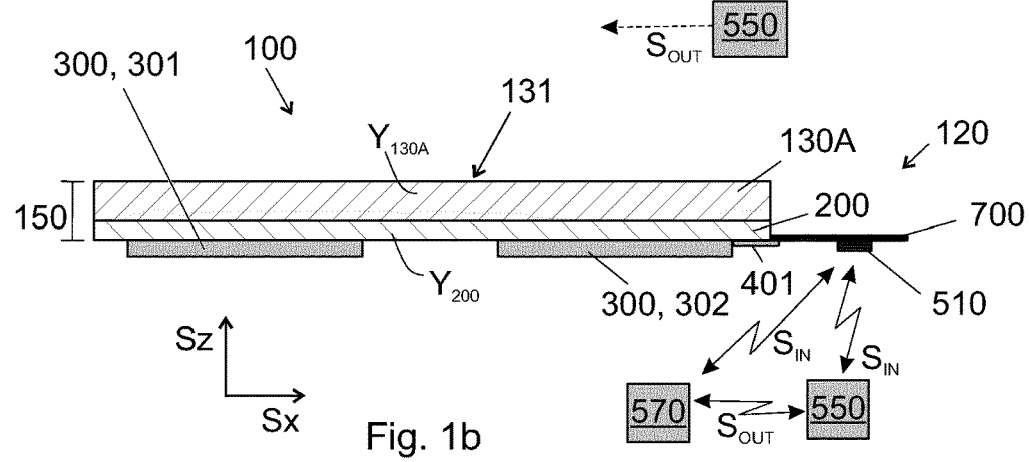

Referring to FIGS. 1a and 1b, the deformable sensor 100 can comprise an elastic and stretchable layer 150. The elastic and stretchable layer 150 can comprise an elastic, deformable layer 130A and/or a flexible and stretchable layer 200. The flexible and stretchable layer 200 is also elastic at least to some extent. The elastic and deformable layer 130A is typically compressible.

The deformable sensor can comprise a first electrically permeable and/or conductive layer 140. The electrically permeable and/or conductive layer 140, 142, related in particular to the permeability of the layer, can pass an electric field through the electrically permeable layer. Further, the electrically permeable and/or conductive layer 140, related in particular to the conductivity of the layer, can form a capacitance in between the electrode and the electrically permeable and/or conductive layer itself. The first electrically permeable and/or conductive layer 140 may serve as a ground electrode. In an embodiment, the electrically permeable and/or conductive layer 140,142 is used to increase the capacitance of the first electrode when compared to situation without said layer.

As discussed above, the sensor arrangement further comprises an electronic arrangement 120. The electronic arrangement 120 can be electrically coupled to the first electrode 301 in order to measure a value of interest of the first electrode 301. The electronic arrangement 120 can be coupled to the first electrode 301 via the first wire 401. The first wire 401 may be seen as part of the electronic arrangement 120 and/or as part of the sensor 100.

In an embodiment, the electronic arrangement 120 is electrically coupled to the electrically permeable and/or conductive layer 140,142 in order to measure e.g. capacitance of the first electrode 301 relative to the electrically permeable and/or conductive layer 140, 142. A common potential, e.g. a ground potential, may be conducted to the electrically permeable and/or conductive layer at least when measuring the capacitance of the first electrode 301 relative to the conductive layer 140, 142. However, the electronic arrangement 120 need not be electrically coupled to the electrically permeable and conductive layer 140,142. Furthermore, the deformable sensor 100 does not need to have said electrically permeable and conductive layer 140, 142.

The deformable sensor 100 can comprise at least one stretchable electrode 300 attached to the flexible and stretchable layer 200 or to the elastic, deformable layer 130A, 130B. To obtain the deformable sensor 100, preferably at least most of the sensor 100 is stretchable and elastic.

The flexible and stretchable layer 200 can be arranged in between a stretchable electrode 300, 301, 302 and the elastic layer 130A, 130B, 150. In some applications, the deformable sensor is more comfortable to use, provided that the elastic deformable layer 130A,130B is directly in contact with the flexible and stretchable layer 200, i.e. the stretchable electrodes 300 are not arranged in between the elastic deformable layer 130A and the flexible and stretchable layer 200.

The flexible and stretchable layer 200, the first and second stretchable electrodes 301, 302, and the electrically conductive wiring 400 can be left on a same side of the elastic, deformable layer 130A. This helps the manufacturability of the deformable sensor 100.

Figure 1C:
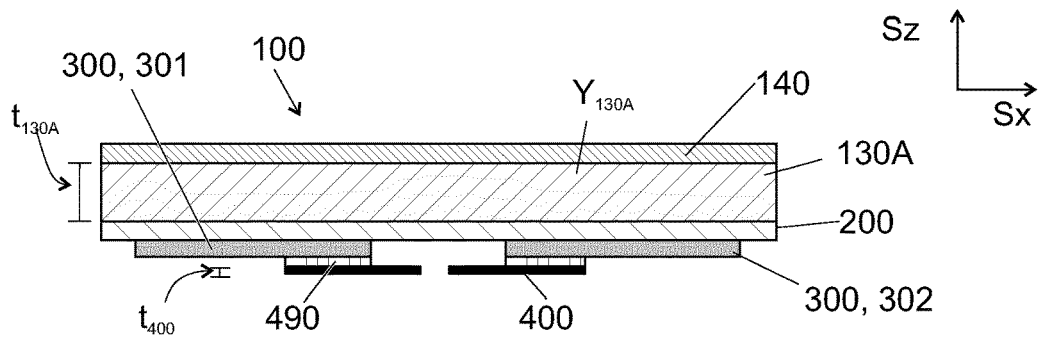
Figure 1D:
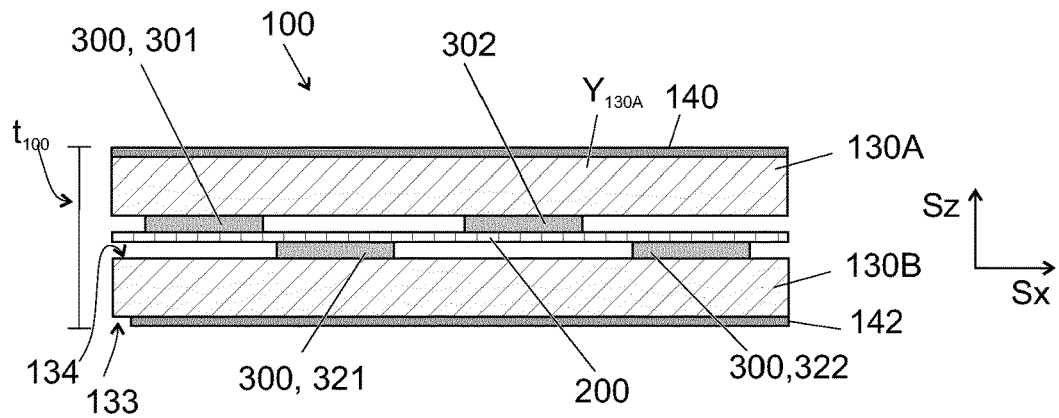
Figure 1E:
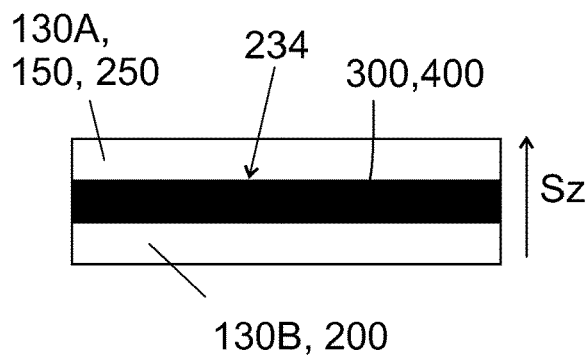
Figure 1F:
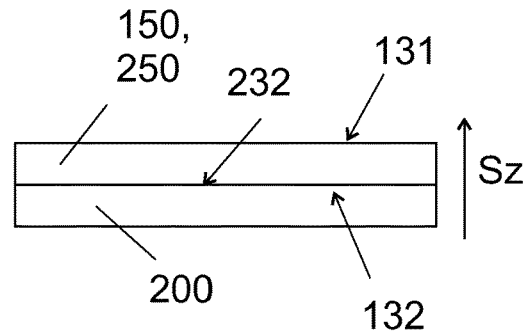

In an embodiment, the flexible and stretchable layer 200 is arranged in between two electrode layers (shown in FIG. 1*d*).

The Young's modulus of the elastic, deformable layer 130A, 130B should be reasonably small. However, many materials that are soft and/or have a small Young's modulus are known to creep. Creep, on the other hand is not preferred, since the permanent compression of the elastic deformable layer 130A, 130B would affect the measurement results.

To ensure reasonable deformations in use, for example for a double curved surface, the elastic deformable layer 130A, 1308 has a third Young's modulus $Y_{130A}$. For example, the material of the layer 130A, 1308 may be selected such that the layer 130A, 130B is compressed, in typical use, about 1 to 15%; such as up to 30%. Naturally, the compression depends on the pressure, which need not be spatially or temporally uniform. Typical pressures may be of the order of 2 kPa to 1000 kPa. Thus, the third Young's modulus $Y_{130A}$ may be e.g. at most 15 MPa or at most 5 MPa. In addition, third Young's modulus $Y_{130A}$ may be e.g. at least 0.01 MPa or at least 0.2 MPa. A large strain (resulting from a small Young's modulus) could make the material of the elastic deformable layer 130A to creep in use. This could deteriorate measurements in the long term. Moreover, a small strain (resulting from a large Young's modulus) is hard to measure.

Thus, a Young's modulus of the elastic, deformable layer(s) 130A, 1308 is/are preferably from 0.01 MPa to 15 MPa, such as from 0.1 MPa to 5 MPa. A Young's modulus in tension may differ from the Young's modulus in compression.

A material of the compressible layer has preferably a yield strain of at least 5 percent, more preferably at least 10 percent. This ensures that the material can be sufficiently compressed in use.

The first elastic, deformable layer 130A and/or the second elastic, deformable layer is/are preferably made by using foaming agents, e.g. thermoplastic micropheres or gases. Thanks to the foaming agents, mechanical properties, of said layer(s), such as compression set, can be improved.

The first elastic, deformable layer 130A and/or the second elastic, deformable layer is/are preferably closed cell foaming thermoplastic elastomers, preferably based on polyurethane, and/or silicone and/or polyester and/or polyethylene resin. Thus, mechanical properties of said layer(s), such as compression set, can be improved.

The first elastic, deformable layer 130A and/or the second elastic, deformable layer 130B can comprise at least one of polyurethane, polyethylene, poly(ethylene-vinyl acetate), polyvinyl chloride, polyborodimethylsiloxane, polystyrene, acrylonitrile-butadiene-styrene, styrene-butadienestyrene, ethylene propylene rubber, neoprene, cork, latex, natural rubber, silicone, styrene-ethylene-butylene-styrene and thermoplastic elastomeric gel. Said polyurethane is preferably thermoplastic polyurethane. Preferably, the total amount of said material(s) is at least 50 wt. %, more preferably at least 70 wt.-% of the first deformable layer.

Preferably, a thickness $t_{130A}$ of the elastic, deformable layer 130A, 130B is equal to or more than 0.1 mm, more preferably equal to or more than 0.2 mm and most preferably equal to or more than 0.3 mm. Further, a thickness $t_{130A}$ of the elastic, deformable layer 130A, 1308 may be equal to or less than 1.5 mm, more preferably equal to or less than 1.0 mm, and most preferably equal to or less than 0.8 mm. Thanks to said thickness of the elastic, deformable layer 130A, 130B a force detection sensitivity may be improved. Further, a structure of the deformable sensor may be improved so that e.g. 3D stretchability may be improved. In an embodiment said thickness is at least 1.0 mm.

The first elastic, deformable layer 130A and/or the second elastic, deformable layer 130B is/are preferably translucent layer(s). In addition, or alternatively, the first elastic, deformable layer 130A and/or the second elastic, deformable layer 130B can have at least one translucent point and/or at least one translucent area.

Therefore, the deformable sensor may comprise the first elastic, deformable layer 130A, which is a translucent layer or has translucent area(s) and/or translucent point(s). Further, the deformable sensor may comprise the second elastic, deformable layer 130B, which is a translucent layer, or has translucent area(s) and/or translucent point(s).

Therefore, the first elastic, deformable layer 130A may have at least one translucent point and/or at least one translucent area. Further, the second elastic, deformable layer 130B may have at least one translucent point and/or at least one translucent area.

In an embodiment comprising the translucent layer(s), the cork or other non-transparent material may not be as preferred material as the other above-listed materials. If non-transparent material(s), such as the cork, is used in the translucent layer/area/point, a microperforation or thinning of the material may be needed for the for the predetermined transparency.

However, if the elastic, deformable layer(s) 130A, 130B comprises both,
  translucent area(s) and/or non-transparent point(s), and
  non-transparent area(s) and/or point(s),
the non-transparent material may be used at least for said non-transparent area(s) and/or point(s). For the translucent area(s) and/or point(s), the non-transparent material may be used e.g. with perforation or thinning of the material in order to indicate a certain point on a surface.

Translucency is measured according to standard ASTM D1746-15. Translucency of the first elastic, deformable layer 130A, or a part of the layer, can be from 10% to 90%, preferably in a range between 40% and 90%, more preferably in a range between 55% and 90%, and most preferably in a range between 70% and 90%. In an example, said translucency of the first elastic, deformable layer 130A, or a part of the layer, is between 10% and 50%.

Translucency of the second elastic, deformable layer 130B, or a part of the layer, may be from 10% to 90%, preferably in a range between 40% and 90%, more preferably in a range between 55% and 90%, and most preferably in a range between 70% and 90%. In an example, said translucency of the second elastic, deformable layer 130B, or a part of the layer, is between 10% and 50%. The higher is the transparency value of the transparent area, the easier the light can go through said area.

Thanks to said translucent layer(s), and/or translucent area(s), and/or translucent point(s), light can go through the layer(s)/area(s)/point(s). Thus, said layer may not need to have holes or a photoconductor for lighting a surface of the layer. Further, a layer having a translucent point(s) and/or a translucent area(s) can be used to indicate a certain point on a surface. However, in an embodiment, the deformable sensor does not have the translucent layer or point(s) at all.

The deformable sensor having the translucent layer(s) and/or translucent area(s) and/or translucent point(s), may be a force sensor and/or pressure sensor. Preferably, the deformable sensor having at least one of the translucent layer(s), translucent area(s), or translucent point(s) may be a touch sensor, wherein a capacitance of an electrode may change by movement of the touching object (e.g. a finger of a user).

For indicating a certain point on a surface, a translucent material may be used together with a stretchable ink. Thus, the stretchable ink may be used to cover a suitable area of the translucent material to obtain a predetermined symbol on the surface. In a preferable embodiment, the stretchable ink is selected from a group comprising copper, silver, carbon, and gold. In this embodiment, the stretchable ink is preferably printable.

Alternatively, or in addition, for indicating a certain point on a surface, a non-transparent material may be used to obtain a predetermined symbol(s) on the surface. The non-transparent material may comprise at least one material selected from the following group:
  cork,
  leather,
  synthetic leather (artificial leather),
  sustainable leather,
  alcantara,
  stretchable ink,
  non-transparent plastic,
  non-transparent thermoplastic materials, such as polycarbonate, or polymethyl methacrylate,
  non-woven fabric,
  woven fabric,
  biocomposites comprising bioplastic and cellulose-based fibers, and
  wood.

The above-listed materials may be used together with a transparent material e.g. to obtain predetermined symbols on the surface of the deformable sensor.

In an embodiment, the deformable sensor may comprise at least 1 layer comprising one or more transparent areas. Further, the deformable sensor may comprise equal to or less than 6 layers comprising one or more transparent areas, such as from 1 to 6 layers comprising one or more transparent areas, more preferably equal to or less than 5 layers comprising one or more transparent areas, and most preferably equal to or less than 4 layers comprising one or more transparent areas.

The deformable sensor 100 typically comprise the flexible and stretchable layer 200. The layer 200 is stretchable in order for it to adapt, in use, to a needed shape. For example, in case a mitt or an insole comprises the sensor, the flexible and stretchable layer 200, in use, may stretch to conform with the dynamic shape of the mitt or the insole. In this way, the stretchability improves the comfort of the sensor. However, for reasonably easy stretching, the flexible and stretchable layer 200 (i.e. the material of the stretchable layer) has preferably a relatively small first Young's modulus $Y_{200}$.

In order to have the deformations within the deformable sensor 100 concentrated mainly in the elastic deformable layer 130A, 130B, the third Young's modulus $Y_{130A}$ of the first elastic, deformable layer 130A, 130B can be smaller than a first Young's modulus $Y_{200}$ of the flexible and stretchable layer 200. This improves the measurement accuracy, as the locations of the compressions are better controlled.

Preferably, the flexible and stretchable layer 200 is flexible in the aforementioned sense. Moreover, preferably, a Young's modulus of the flexible and stretchable layer 200 is at least 0.01 MPa and at most 10 GPa, such as at most 5.0 GPa. Thus, the deformable sensor can be used in many different kinds of applications.

The flexible and stretchable layer 200 may be made of suitable polymer film. The flexible and stretchable layer 200 may be made of suitable fabric. The flexible and stretchable layer 200 can comprise polyimide, polyethylene naphthalate, polyethylene terephthalate, polyetheretherketone, thermoplastic polyurethane), polyethylene, poly(ethylene-vinyl acetate), polyvinyl chloride, polyborodimethylsiloxane, polystyrene, acrylonitrile-butadiene-styrene, styrene-butadienestyrene, styrene-ethylene-butylene-styrene ethylene propylene rubber, neoprene, cork, latex, natural rubber, siloxane polymer (such as silicone), and/or thermoplastic elastomeric gel. Preferably, the total amount of said material(s) is at least 50 wt. %, more preferably at least 70 wt.-% of stretchable layer. Therefore, the flexible and stretchable layer 200 may act as a flexible insulator.

In an advantageous embodiment, the flexible and stretchable layer 200 comprises a polymer film, such as a film of thermoplastic polyurethane (TPU) or thermosetting resin, e.g. cured epoxy resin. Preferably, the total amount of said material(s) is at least 50 wt. %, more preferably at least 70 wt.-% of stretchable layer. Thus, the flexible and stretchable layer 200 may act as a flexible insulator and it may be easy to manufacture.

The thermoplastic polyurethane (TPU), if used, may comprise polyester-based TPU and/or polyether-based TPU. In an embodiment, the flexible and stretchable layer 200 comprises fabric, e.g. polyamide (such as nylon) or polyester. The flexible and stretchable layer 200 may comprise said fabric and said film. Preferably, the total amount of the material(s) is at least 50 wt. %, more preferably at least 70 wt.-% of the flexible and stretchable layer 200.

In an embodiment, the flexible and stretchable layer 200 comprises the thermoplastic polyurethane TPU and the stretchable electrodes 300 are made from conductive ink. In an embodiment, the flexible and stretchable layer 200 comprises non-conductive fabric in between the stretchable electrodes 300, and the stretchable electrodes 300, or at least some thereof, may have been made using conductive fabric, such as polyamide or polyester that is coated by a metal, such as silver. In the alternative or in addition, conductive ink may be used in combination with fabrics to form the stretchable electrodes 300 or at least some thereof.

The elastic and stretchable layer 150 can serve for the purposes of both the flexible and stretchable layer 200 and the first elastic, deformable layer 130A (see FIGS. 1a-1c). The properties of the elastic deformable layer 130A, in particular the Young's modulus thereof, may apply also the elastic and stretchable layer 150. Thus, the Young's modulus $Y_{150}$ of the elastic and stretchable layer 150 may be within the limits discussed in this application for the elastic, deformable layer 130A. Still further, what will be said about the thickness $t_{130A}$ or the direction of the thickness $t_{130A}$ of the elastic, deformable layer 130A may apply to the thickness $t_{150}$ of the elastic stretchable layer 150 and the direction of the thickness $t_{150}$.

The elastic deformable layer 130A, 130B, 150 can have holes that extend in the direction of the thickness $t_{130}$ of the elastic deformable layer 130A, 130B, 150 (not shown in Figures). Such holes in effect make the material softer. Thus, by having the holes, it is possible to use a harder material and/or a material with a higher Young's modulus. Such a material typically creeps significantly less than softer materials. The effect of the holes is to reduce the area of that part of the elastic deformable layer 130A, 130B that comprises the deformable solid material.

If the elastic, deformable layer 130A, 130B has the holes, the total cross-sectional area of the holes constitutes preferably at least 5%, more preferably at least 10% of the cross-sectional area of the elastic deformable layer 130A, 130B. Such a material typically creeps significantly less than softer materials. Herein the cross section refers to a cross section on a plane that has a surface normal that is parallel to the direction of thickness. Moreover, the total cross-sectional area of the holes refers to the sum of the cross-sectional areas of the individual holes. Still further, the cross-sectional area of the elastic deformable layer 130A, 130B refers to the area of a section limited by the outer boundary of the elastic deformable layer 130A.

In an embodiment, at least some of the holes extend from a first side 131,133 of the elastic, deformable layer 130A, 130B, through the elastic, deformable layer 130A, 130B, to a second side 132,134 of the elastic deformable layer 130A, 130B. In addition to softening, such through-holes may improve ventilation of the sensor 100. In case the sensor 100 comprises the additional elastic deformable layer 130B, in an embodiment, at least some holes extend from a first side 133 of the second elastic deformable layer 130B, through the second elastic deformable layer 130B, to a second side 134 of the second elastic deformable layer 130B. In an embodiment, the holes extend in the direction of the thickness of the elastic and stretchable layer 150. The holes may extend from one side of the elastic and stretchable layer 150 to the opposite side of the elastic and stretchable layer 150 in the direction of the thickness of the elastic and stretchable layer 150.

The holes can be used engineer the local effective hardness of the elastic deformable layer 130A, 130B. By using holes, a region can be made softer than another region, even if the same material is used in both regions. Correspondingly, in areas, where the load (e.g. force or pressure) is known to be small, a lot of holes can be made to soften the material a lot. A lot of holes refer to the total cross-sectional area of the holes in proportion to the corresponding region of the deformable layer 130A. By increasing the size and/or number of the holes, the material can be made softer. The engineering of the softness may be more effective when the number of holes is significant. For example, the number of holes may be at least ten or at least fifty.

Preferably, the deformable sensor 100 comprises multiple electrodes (see FIGS. 2a-b). Preferably, the electrodes are arranged in such a way that a value of interest is measurable using all electrodes simultaneously. In particular, in an embodiment, the electrodes cover most of the cross-sectional area of the sensor, such as at least 50% or at least 80% of the cross-sectional area. In an advantageous embodiment, a capacitance is measurable by the deformable sensor 100 by using all electrodes simultaneously over the whole cross-sectional area covered by the electrodes.

The first electrode 301 can form a part of the wiring 400. In this case, at least a part of the first electrode 301 is preferably arranged on the same side of a substrate, such as the flexible and stretchable layer 200, as the wiring 400. In such a case, preferably the (whole) first electrode 301 is arranged on the same side of the substrate as the wiring 400. In case the elastic, deformable layer 130A is used and the first electrode forms a part of the wiring 400, preferably at least a part of the first electrode 301 is arranged in between the flexible and stretchable layer 200 and the elastic, deformable layer 130A. In such a case, preferably the (whole) first electrode 301 is arranged in between the flexible and stretchable layer 200 and the elastic, deformable layer 130A.

In an embodiment, the electrode(s) 300 define measurement areas. Within a measurement area, at least one electrode 300 is arranged. The measurement area defined by the electrode is the area, from which values, e.g. capacitance, are configured to be measured by the electrode. Electrodes of two different measurement areas are not preferably in a galvanic contact with each other.

In a preferable embodiment, the measurement area comprising the first primary electrode 301 does not partially overlap with the measurement area comprising the first secondary electrode 321 in the direction Sz of the thickness of sensor 100. There may be some overlap between the electrodes, but preferably, the amount of overlap with the measurement areas is small.

In the alternative, large one of the overlapping measurement areas may comprise the whole of the smaller measurement area. In an embodiment, the deformable sensor is a capacitive sensor. Then, when the capacitances are measured, preferably relative to at least one electrically permeable and/or conductive layer 140, 142, the capacitance of the non-overlapping part can be computed from the measurements. The capacitances of the smaller electrode and larger electrode may be measured e.g. subsequently, and the capacitance of the non-overlapping part can be computed by subtraction.

As discussed above, the sensor arrangement comprises the deformable sensor 100 and the electronic arrangement 120. Thus, it is possible to collect data from the deformable sensor 100 and analyze and/or transmit the collected data by using the electronic arrangement 120.

The electronic arrangement 120 can be configured to obtain a signal indicating a value of interest from the deformable sensor 100.

The electronic arrangement 120 can comprise,
means for obtaining data (signals) from the deformable sensor,
optionally analyzing means,
optionally transmitting means, such as a wireless component, and
a power supply.

The electronic arrangement 120 can comprise a processor, which can be configured to process data coming from the deformable sensor. The processor can be configured to analyze data based on signals of the deformable sensor.

For example, the processor can be programmed to calculate values representative of a value of interest.

The electronic arrangement 120 can comprise a memory. Thus, the electronic arrangement 120 can store the values of parameters and calculations. Therefore, the electronic arrangement 120 can be configured to store the measurement results to the memory of the electronic arrangement 120. This allows for analyzing the measurement data by using the electronic arrangement 120.

Preferably, the electronic arrangement 120 comprises an electronic chip 510 that is configured to convert capacitance(s) to digital form. Such chips are commonly known as a capacitance to digital converters (CDC). Thus, in an embodiment, the controller comprises a capacitance to digital converter.

Transmitting means of the electronic arrangement 120 can comprise a component for transmitting and, optionally, receiving data.

The transmitting means can be based on a wireless technology, such as
Radio Frequency Identification (RFID),
BT (Bluetooth),
Wireless Local Access Network (WLAN),
Near Field Communication (NFC),
Cellular systems 4G, or
Cellular systems 5G
but it may alternatively be based on any other wireless technologies.

Alternatively, instead of the wireless technologies, the transmitting means can be based on
USB
Ethernet
CAN
LIN,
MOST
FlexRay, or
UART
technology.

Thus, in case of the wireless technology, the electronic arrangement 120 can comprise an antenna to provide wireless connectivity, and a communication insert, such as a communication circuit to perform communication via the antenna. The antenna can be incorporated in a communications circuit, or it may be separate from but in electric connection to the communications circuit. The communication insert can be coupled to a processor of the deformable sensor, which can be linked to a transmitter further connected to an antenna.

Preferably, the transmitting means, i.e., the transmitter, is configured to transmit value(s) based on the measurements of the deformable sensor.

The electronic arrangement 120 of the deformable sensor can be configured to transmit obtained values, for example calibrated values, to an external unit 550 and/or to a cloud service unit 570. Thus, the electronic arrangement 120 of the deformable sensor can cause that the obtained values are transmitted outside of the deformable sensor 100.

In an embodiment, the electronic arrangement 120 comprises a circuit board 700, electrically coupled to the first electrode 301; and an electronic chip 510 attached to the circuit board 700. The electronic arrangement 120 of the deformable sensor 100 may comprise one or more electronic chips 510, such as microchips. Thus, deformable sensor 100 can comprise at least one circuit board 700 attached to the wiring 400 in an electrically conductive manner, and electrically coupled to the first electrode 301. The circuit board is preferably a flexible circuit board. The flexible circuit board can improve deformability of the deformable sensor. However, in another embodiment, the circuit board is only partly flexible. Further, the circuit board may not be flexible at all.

As for suitable materials for the circuit board 700, particularly for the flexible circuit board, these include polyimide, polyethylene naphthalate, polyethylene terephthalate, and polyetheretherketone. In an embodiment, the flexible circuit board 700 comprises material selected from a group consisting of these materials. Most preferably, the flexible circuit board comprises polyimide and/or polyethylene terephthalate. The flexibility of the flexible circuit board 700 is also a result of the board 700 being relatively thin. In an embodiment, a thickness of the flexible circuit board 700 is less than 1 mm, such as at most 0.5 mm or less than 0.4 mm.

In addition, the circuit board 700 can comprises electrically conductive wiring. An electric conductivity of the wiring of the circuit board 700 may be at least 1 S/m at a temperature of 20° C.

The electronic arrangement 120, when coupled to the deformable sensor 100, can be configured to measure the value of interest of at least one of the stretchable electrodes 300, preferably each one of the stretchable electrodes separately. In an advantageous embodiment, the electronic arrangement 120 is configured to measure the capacitance of each one of the stretchable electrodes 300 separately.

The electronic arrangement 120 can comprise a data storage, such as at least one memory component. Alternatively, or in addition, the processor of the electronic arrangement 120 can comprise memory. Thus, the electronic arrangement 120 can be configured to store the measurement results to a memory of the deformable sensor arrangement. This allows for analyzing the measurement data at least after measurements. The values representative of the value of interest can be calculated in the electronic arrangement 120 of the sensor.

The deformable sensor consumes energy when its measuring and/or analyzing and/or transmitting data. The deformable sensor can comprise a power source, preferably an electric power source, such as a battery, to provide electricity for powering the functionality of the deformable sensor 100. The power source may be e.g. configured to transform mechanical and/or chemical energy to electric energy. As an alternative or in addition, the electric source may comprise a component configured convert magnetic energy into electricity. As an alternative or in addition, the electric source may comprise high-capacitance capacitor (e.g. a super capacitor) storing electric energy as such. Such a high-capacitance capacitor can be charged e.g. inductively or electrically with a component transforming magnetic or mechanical energy, respectively, to electricity. Furthermore, the power source may comprise an energy harvesting device, such as a piezoelectric energy harvesting device, thermoelectric harvesting device, or a triboelectric energy harvesting device, which device may comprise a battery and/or a capacitor as one of its elements.

Most preferably, the power source is a battery configured to provide electricity by converting chemical energy into electricity. Therefore, it is possible to achieve simple and cost-effective solution. Preferably, the battery is rechargeable.

In an embodiment, the data from the deformable sensor 100 is not analyzed in connection to the deformable sensor arrangement, in order to save energy consumption of the deformable sensor arrangement. In another embodiment, it is not necessary to save energy consumption of the deformable sensor arrangement, hence, the data from the deformable sensor 100 is preferably analyzed, at least partly, in connection to the deformable sensor arrangement.

The transmitting means can be used to send at least some measured parameters from the deformable sensor arrangement to the external control unit 550 or directly to a cloud service unit 570. Preferably, the transmitting means are configured to send the data to the external control unit 550 near the sensor arrangement in order to save energy. In an embodiment, an antenna may be arranged to wirelessly transmit information from the electronic arrangement 120 to a receiving device, e.g. the external control unit 550, located at a distance from the deformable sensor. The values representative of the value of interest can be calculated in the external control unit 550 or cloud service unit 570. Thus, it is possible to save energy of the deformable sensor arrangement. Alternatively, the values representative of the value of interest can be calculated in connection to the deformable sensor arrangement, preferably by using the electronic chip 510, and optionally transmitted to the cloud service unit or to the external control unit 550. Thus, the cloud service unit 570 can make it possible for individuals to collect data and analysis the collected data in real-time, anywhere.

If the deformable sensor arrangement comprises the circuit board 700, such as the flexible circuit board 700, it may be electrically coupled to the first electrode 301. Moreover, the electronic chip 510 can be attached to the circuit board 700 and configured to measure value, such as capacitance of the first electrode. The electronic arrangement 120 can be configured to send the measurement results to an external control unit 550, for example by using an electronic chip 510. Therefore, the electronic chip 510 may be configured to send a signal $S_{in}$ to an external control unit 550, or to a cloud service unit 570. Then, the external control unit 550 or the cloud service unit 570 may receive the signal $S_{in}$ and determine following steps. The signal $S_{in}$ may be sent via a wire or wirelessly. In an embodiment, the electronic arrangement 120 is configured to send the data wirelessly. This allows for analyzing the measurement data in real time.

The external control unit 550 can be, for example, a mobile phone, a tablet, or a personal computer (such as a laptop computer). The external control unit can comprise a processor, a memory data storage unit (i.e., a memory) for values, such as parameters and calculations, and a computer code to be executed by the processor, and a user interface having, for example, an operator display and a keyboard (not shown in the Figures). The operator display can provide status information and warnings. The external control unit 550 can further comprise a sensor interface for receiving the outputs from the sensor. There can also be a power supply for supplying power for the operation of the external control unit 550.

For communication purposes, the external control unit 550 may be equipped with a communication interface, which may be able to communicate with some other devices, e.g. a cloud service unit, via short range and/or long-range communication connection. Thus, the external control unit 550 can be configured to communicate with a service provider, such as a mobile phone network.

The memory data storage unit of the external control unit 550 can store the values of parameters and calculations. Therefore, the external control unit 550 can be configured to store the measurement results to a memory of the external control unit. This allows for analyzing the measurement data by using the external control unit 550.

Preferably the electronic arrangement 120 stores at least the material compensation coefficients 181, hence, it is possible to calibrate the deformable sensor easily, reliable and fast, by simply obtaining measurement results on the current surface, to obtain assembly compensation coefficients 182.

The memory of the electronic arrangement 120 can also store said assembly compensation coefficients 182. Thus, it can be possible to calibrate the measured values easily, reliable and fast.

The memory of the electronic arrangement 120 and/or the memory of the external control unit 550, can maintain history data at least for a predetermined time. Furthermore, the memory can be used, not only for storing the data, but also for storing computer code to be executed by the processor of the external control unit 550 and/or the electronic arrangement 120.

The computer code can use the material compensation coefficients 181 in order to obtain the assembly compensation coefficients 182. Thus, it is possible to calibrate the deformable sensor on non-planar surfaces easily and fast. Calibration of the deformable sensor on non-planar surfaces could be very slow and difficult operation without said material compensation coefficients 181 comprising typically a function that includes an effect of temperature on the signals of the deformable sensor as well as behavior of the deformable sensor on planar surfaces.

The computer code preferably uses the assembly compensation coefficients 182 in order to obtain calibrated values from measured signals. Thus, it is possible to obtain reliable data from non-planar surfaces.

The external control unit 550 can have a receiver or a receiver-transmitter, positioned to receive the digital data such as signals $S_{in}$ transmitted by the transmitter of the deformable sensor arrangement. When the external control unit 550 is used, a computer program may run on the external control unit 550. Such a computer program, when run on the external control unit 550, can be configured to cause the external control unit 550 to receive a signal $S_{in}$.

In an embodiment, a computer program, when run on the external control unit 550, is configured to cause the external control unit 550 to receive such raw signal $S_{in}$ that is indicative of a value measured by the deformable sensor 100. Further, the computer program, when run on the external control unit 550, can be configured to cause the external control unit 550 to determine a calibrated value from the signal $S_{in}$.

Alternatively, or in addition, the electronic arrangement 120 can have a receiver or a receiver-transmitter, positioned to receive the digital data. In addition, the electronic arrangement 120 can have a computer code which can be configured to cause the electronic arrangement 120 to determine a calibrated value from a raw value.

The measured value may be a value of a voltage, capacitance, resistance, or a current, if the value of the first electrode is sent as an analogue signal. Preferably, the value is a digital value of the interest. Thus, the electronic arrangement 120 is preferably configured to convert the measured signal to a digital signal.

Typically, measurements include noise. Therefore, even if there is not object in a vicinity of the sensor 100, a signal measured therefrom may not be constant. Thus, the signal is preferably filtered. Thus, in an embodiment, the effect of noise is removed by filtering the data.

The electronic arrangement 120 and/or a system comprising the electronic arrangement can be configured to determine material compensation coefficients 181. The material compensation coefficients can be determined for one deformable sensor and, afterward, used for all similar deformable sensors. The material compensation coefficients 181 can be determined, for example, for different temperatures and/or moistures. Further, the material compensation coefficients can be stored to a memory of the deformable sensor, for example, during a manufacturing process of the deformable sensor. Thus, it is not necessary to redetermine the material compensation coefficients 181 separately for each manufactured deformable sensor. However, the material compensation coefficients can be calibrated, if wanted, for each manufactured deformable sensor after the manufacturing process of said sensor.

Thus, as discussed, the material compensation coefficients 181 needs not to be determined separately for each of the deformable sensors, but the material compensation coefficients 181 can be determined once and afterward, when manufacturing deformable sensors, the material compensation coefficients 181 can be stored to the memory of the deformable sensor.

The material compensation coefficients 181 can be used, for example, to determine assembly compensation coefficients 182 of the deformable sensor on its current surface.

The electronic arrangement 120 and/or the external unit 550 can be configured to determine a calibrated value from a measured raw value. The calibrated value of the deformable sensor can be determined based on the assembly compensation coefficients 182.

The deformable sensor arrangement and/or a system comprising the deformable sensor arrangement can be configured to:
    obtain raw values (signals) by using the deformable sensor 100,
    optionally, determine filtered values from the raw values (signals),
    determine a calibrated value based on
        the raw values and/or filtered values, and
        the material compensation coefficients 181 and/or the assembly compensation coefficients 182
    optionally check the reliability of the data, for example by comparing the calibrated value with previously measured values.

Further, the electronic arrangement 120 and/or a system comprising the electronic arrangement can be configured to determine third reference values, i.e., a third curve 183, indicative of signals on installing position of the deformable sensor 100, i.e., after installation of the deformable sensor to a current surface (See FIGS. 5b, 6b and 8a) before recalibration of the deformable sensor. The current surface may be e.g. planar, curved, or double curved surface.

Further, the electronic arrangement 120 and/or a system comprising the electronic arrangement can be configured to determine assembly compensation coefficients (See FIG. 8b). The assembly compensation coefficients 182 are based on the material compensation coefficients 181, which are calibrated for the current form of the deformable sensor.

The third reference values 183 indicating measured values before re-calibration (see FIGS. 6b and 8a) can be used together with the material compensation coefficients 181 to form assembly compensation coefficients 182 (see FIG. 8b). The assembly compensation coefficients 182 can be used to determine calibrated values from signals of the deformable sensor. Thus, the assembly compensation coefficients can be used to get calibrated measurement results, even when the deformable sensor 100 is on a non-planar surface.

The system comprising
    the deformable sensor and
    the electronic arrangement 120 preferably comprising the electronic chip 510, and
    optionally the external unit 550, 570
may be configured to determine assembly compensation coefficients 182 for interpretation of the measurement values. Furthermore, the system may be configured to determine corrected (calibrated) values from the raw signals or filtered signals based on the assembly compensation coefficients 182.

The external unit 550, 570 and/or the electronic arrangement 120 of the deformable sensor may be configured to determine the calibrated values 182.

The external unit 550, 570, such as the external control unit 550 or the cloud service unit 570, and/or the electronic arrangement 120 of the deformable sensor, can be configured to send an output signal $S_{out}$ comprising the calibrated values. Correspondingly, the computer program, when run on the external unit 550, 570, and/or on the electronic arrangement 120 of the deformable sensor, may be configured to generate such an output signal $S_{out}$ that is indicative of the calibrated values.

The material compensation coefficients 181 can be stored on a memory, or they can be determined at a planar surface. The material compensation coefficients 181 can be used for determining the assembly compensation coefficients 182 simply by measuring at least one measurement by the deformable sensor on its current position, without major calibration efforts. The assembly compensation coefficients can be used to determine calibrated values from signals of the deformable sensor.

The assembly compensation coefficients 182 can be determined in installing position of the deformable sensor, i.e., after an installation process of the deformable sensor 100. An example of measurement ranges on a planar surface are generally illustrated in FIG. 5a and on non-planar surface without the calibration in FIG. 5b.

The determination of the material compensation coefficients 181 can comprise the following steps:
  measuring signals (outputs from electrodes) of the deformable sensor 100 on a planar surface,
  determining material compensation coefficients 181, based on the measured signals.

The deformable sensor arrangement preferably measures a temperature during the measurements. Furthermore, the material compensation coefficients 181 preferably include an effect of a temperature on the signals. Thus, the calibrated values can be reliable determined even if the assembly compensation coefficients 182 are formed fast, i.e., by using only the current temperature.

The determination of the assembly compensation coefficients 182 can comprise, for example, the following steps:
  i) measuring signal(s) (output(s) from electrode(s)) of the deformable sensor 100 after installing the deformable sensor on a surface,
  ii) determining values indicating that no object to be measured has an effect on the sensor on the surface,
  iii) comparing the measured signals to the material compensation coefficients 181,
  iv) determining the assembly compensation coefficients 182 based on the material compensation coefficients and the measured signals.

The method for determining a value of interest can comprise the following step:
  measuring at least one signal (output(s) from electrode(s)) of the deformable sensor 100,
  optionally, transmitting at least some values based on the measured signals,
  comparing the signals and/or values determined from the signals to the assembly compensation coefficients 182, and
  determining calibrated value(s) based on the measured signal(s) and the assembly compensation coefficients 182.

Figure 6A:
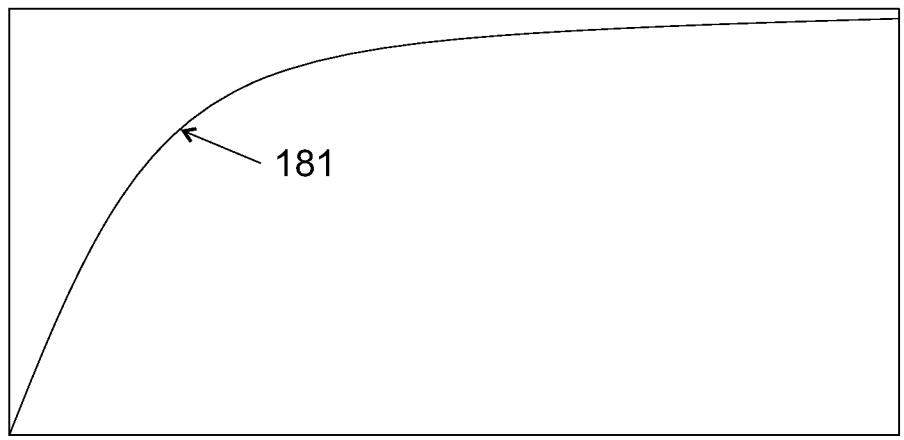
FIG. 6*a* illustrates an example of material compensation coefficients.
Figure 6B:
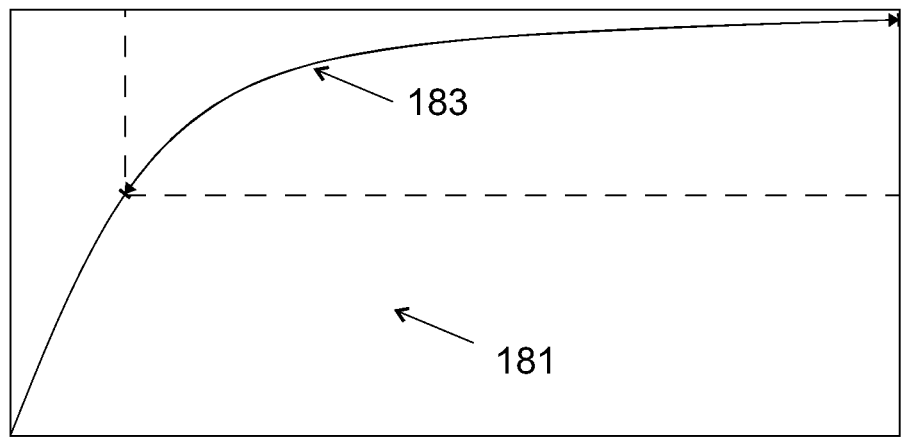
FIG. 6*b* illustrates an example of the material compensation coefficients and a third curve.
Figure 6C:
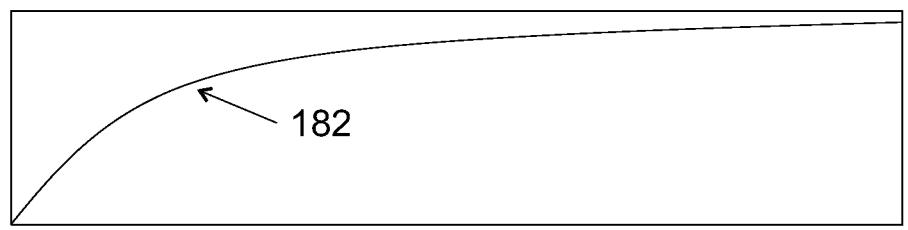
FIG. 6c illustrates an example of assembly compensation coefficients.

As discussed above, the material compensation coefficients 181 can represent signals of the deformable sensor on a planar surface (See FIG. 5a, 6a). Thus, the material compensation coefficients 181 can be calculated as a function of the electric values on a planar surface. Advantageously, the material compensation coefficients 181 uses a temperature as a variable. Thus, the measurement results can be improved.

The data showing the material compensation coefficients 181 can be stored to a memory of the electronic arrangement and/or external unit 550, 570. Thus, the material compensation coefficients 181 can be determined only once, stored to a memory, and used when needed.

As discussed above, the assembly compensation coefficients 182 can be calculated as a function of the electric values on an installing surface in which the sensor is positioned. The installing surface in which the sensor is positioned can be non-planar. The non-planar surface can be a double curved surface. The data showing the material compensation coefficients and/or the assembly compensation coefficients 182 can be stored to a memory of the electronic arrangement and/or external unit 550, 570. Thus, the assembly compensation coefficients 182 may be calculated only once for each installation position, stored to a memory, and used when needed.

The electronic arrangement 120 and/or the external unit 550, 570 can be configured to determine the material compensation coefficients 181 and/or the assembly compensation coefficients 182, wherein the assembly compensation coefficients 182 can be determined based on the material compensation coefficients, and signals measured on the second surface (i.e., on the installing position of the deformable sensor).

The system can comprise:
  means for collecting data from the deformable sensor(s),
  a memory comprising
    the material compensation coefficients, and
    the assembly compensation coefficients 182,
  means for analyzing the collected data to form calibrated data based on the collected data and the assembly compensation coefficients.

Comparison of values can be done in the electronic arrangement 120. In an embodiment, the comparison is done in the external unit 550. Thus, the calibration, i.e. determination of calibrated value(s) based on reference values and measurement signals, may take place e.g. in the external unit 550, 570. The external unit 550, 570 may be configured to send an output signal $S_{out}$ comprising the calibrated value. In addition, or alternatively, the electronic arrangement 120 may be configured to send an output signal $S_{in}$ comprising the calibrated value.

The signal $S_{in}$, $S_{out}$ may be indicative of a calibrated value(s) and/or material compensation coefficients 181 and/or assembly compensation coefficients 182. Furthermore, the signal $S_{in}$ may be indicative of uncalibrated, measured signal(s).

The assembly compensation coefficients 182 can be determined after installation process of the deformable sensor, i.e., when the deformable sensor is in its installation position. If the deformable sensor is installed on a planar surface, the assembly compensation coefficients 182 may all be 1. Therefore, only the material compensation coefficients might have an effect on the calibrated values if the deformable sensor is installed on a planar surface.

However, the deformable sensor is also installable on a non-planar surface. Thus, typically the assembly compensation coefficients 182 are needed for a reliable data. The measured signals can be applied with the assembly compensation coefficients 182 to determine forces affecting to the deformable sensor in its installing position.

The installing position typically has an effect on the signals of the deformable sensor. Thus, the signals of the deformable sensor can show different values on different surfaces even when no object is affecting the deformable sensor (See FIGS. 5a-b). The assembly compensation coefficients 182 represent coefficients needed for the signals in installing position of the deformable sensor, on the current surface. If the deformable sensor 100 is installed to another surface, or is in another form on the current surface, new assembly compensation coefficients can (and typically should be) determined.

As discussed above, the deformable sensor 100 can be configured to provide signals. The electronic arrangement 120 can be configured to read signals of the deformable sensor 100. The system can be configured to
  determine material compensation coefficients on a planar surface, and/or to use the material compensation coefficients stored to a memory, and/or
  determine assembly compensation coefficients 182 in an installing position of the deformable sensor, and/or to use the assembly compensation coefficients stored to a memory, and/or
  determine a calibrated value from the read signals by using the assembly compensation coefficients.

The material compensation coefficients 181 are preferably determined before first installation of the deformable sensor 100.

The assembly compensation coefficients 182 are preferably determined for each installing position of the deformable sensor, or each time a form of the deformable sensor changes.

In accordance with an embodiment, at least some of data collected from the deformable sensor is saved in order to form history data. This history data can be analyzed and/or compared, for example, to the material compensation coefficients. Alternatively, or in addition, this history data can be analyzed and/or compared to the assembly compensation coefficients.

Alternatively, or in addition, this history data can be analyzed and/or compared to new measurement signals. Thus, it is possible to determine, for example, if the installation surface is changing. Thus, the deformable sensor can be used to determine a need for a maintenance of the object, onto which the sensor is installed. Therefore, the deformable sensor can be configured to notice a need for a maintenance of an object in which the sensor is positioned.

Thus, the system can be configured to compare at least one uncalibrated value based on at least one new measurement to at least one other uncalibrated value stored to memory, which said at least one other uncalibrated value was preferably obtained right after the deformable sensor was installed to the current surface.

The difference between the at least one new value and the at least one stored value can be used to determine whether the installing surface in which the sensor is positioned is still in suitable condition. Then, the system can be configured to display whether the installing surface in which the sensor is positioned is still in suitable condition.

Optionally, the collected data, or at least some of the collected data is shown to a user using a local display. The external unit 550, 570 may be configured to display a value of interest, such as a pressure and/or force e.g. for a user.

The electronic arrangement 120 of the deformable sensor 100 can be fixedly positioned close to the first electrode 301. The electronic arrangement 120 may serve as a reading device. Such an arrangement enables reliable interaction between the first electrode and the electronic arrangement 120.

As discussed, the deformable sensor 100 can comprise transmitting means for transferring at least some of the measured data (the outputs of the sensor 100) to, for example, an external control unit 550.

In an embodiment, the electronic arrangement 120 is configured to receive data from another deformable sensor. Moreover, in an embodiment, the electronic arrangement 120 is configured to send such data to another external control unit. In this way, multiple deformable sensors can send measurement data via other deformable sensors, for example, to the external control unit 550.

In an embodiment, the external unit 550, 570 is configured to receive data from multiple deformable sensors, for example, from at least 3 deformable sensors.

The deformable sensor can comprise the elastic, deformable layer 130A, 130B. At least this elastic, deformable layer 130A, 130B is deformable, i.e. it can deform in use. As a result, the measured values of an electrode 300 may change. This change can be used for measurements. Furthermore, this change can be used to calibrate the deformable sensor by determining the assembly compensation coefficients 182.

The shape of the deformable sensor 100 (in use) can be, for example, planar, curved or double curved. Moreover, its shape may be different from the shape when stored. For example, the deformable sensor 100 can be stored in a planar form and, in use, the shape may conform to the shape of the surface in which the deformable sensor is positioned.

The sensor 100 can comprise a top layer. A thickness of the top layer may be e.g. at least 0.1 mm, such as at least 0.5 mm. In this case, at least a part of the first wire 401, and the elastic layer(s) 150, 130A, 130B are arranged on a same side of the top layer. The top layer may be finished e.g. for visual appearance of the sensor and/or for improved comfort of use. Preferably, the top layer is made of textile (synthetic or natural). In an embodiment, the top layer comprises fibrous material. In an embodiment, the top layer comprises woven fibrous material. The reinforcement structure 250 may be a top layer and can be finished according to needs. Thus, the reinforcement structure may be used as a top layer. This may improve a reliability of the sensor 100.

The reliability of the sensor 100 may be further improved by applying a bottom layer. A thickness of the bottom layer may be e.g. at least 0.1 mm, such as at least 0.5 mm. When the bottom layer is attached to the first wire 401, optionally via other parts of a multilayer structure, also the bottom layer provides for mechanical support for the wire 401, and in this way improves reliability. At least a part of the first wire 401 can be arranged in between the elastic layer 130A, 130B, 150 and the bottom layer in the direction Sz of the thickness Sz of the sensor. The material of the bottom layer may be selected according to needs. In case the bottom layer needs to be conformable and/or configured to be compressed in use, the material of the bottom layer may be selected from the group consisting of polyurethane, polyethylene, poly (ethylene-vinyl acetate), polyvinyl chloride, polyborodimethylsiloxane, polystyrene, acrylonitrile-butadiene-styrene, styrene-butadienestyrene, ethylene propylene rubber, neoprene, cork, latex, natural rubber, silicone, and thermoplastic elastomeric gel. However, in case it suffices that the bottom layer is flexible, also a material selected from the group consisting of polyimide, polyethylene naphthalate, polyethylene terephthalate, and polyetheretherketone can be used.

The bottom layer may be finished e.g. for visual appearance of the sensor and/or for improved comfort of use.

The deformable sensor 100 can comprise a second reinforcement structure, such as a second reinforcement layer. The top layer can be the first reinforcement structure 250, and the bottom layer can be a second reinforcement structure. If the deformable sensor 100 comprises the first reinforcement structure 250 and the second reinforcement structure 250 as well as a separate bottom layer, preferably, both reinforcement structures are arranged on a same side of the bottom layer.

As discussed above, the deformable sensor can comprise several layers, for example 2-10 layers. The deformable sensor can comprise, for example, 1 to 6 insulating layers,
1 or 2 electrode layers 300, and
0 to 3 electrically permeable and/or conductive layers.
The system comprising
the deformable sensor having the above-mentioned number of layers, and
the computer code using the assembly compensation coefficients 182
in order to obtain calibrated values from measured signals can be used to obtain reliable data from non-planar surfaces.

For example, a structure comprising at least 3 insulating layers and 2 electrode layers can be used to measure pressure more accurately than e.g. the structure having only one electrode layer. However, the layered sensor structure having many layers is more complex than a sensor comprising only some layers, whereby it would be more expensive to manufacture.

When the deformable sensor 100 comprises two electrically permeable and/or conductive layers 140, 142, an insulating layer can be arranged in between each of the electrically permeable and/or conductive layers 142 and electrodes 321, 322. Thus, an insulating layer can be arranged in between the first electrically permeable and/or conductive layer 140 and the electrodes 301, 302 and between the second electrically permeable and/or conductive layer 142 and the electrodes 301, 302.

As for the material of the first electrically permeable and/or conductive layer 140, the first electrically permeable and/or conductive layer 140 may comprise at least one of
electrically conducting material made from conductive ink,
electrically conductive fabric, and
electrically conductive polymer, such as a film made of the polymer.

These materials can be used to obtain an improved deformable sensor.

Conductive polymer-based material may serve as the material for the conductive area(s), such as electrically permeable and conductive layer 140, 142. Such conductive polymer-based material typically comprises conductive particles, such as flakes or nanoparticles, attached to each other in an electrically conductive manner. In an embodiment, the electrically conductive particles comprise metal (e.g. copper, aluminium, silver, gold) or carbon (including, but not limited to graphene and carbon nanotubes). In addition, conductive polymer-based materials include polyaniline, a polyvinyl (e.g. polyvinyl alcohol or polyvinyl chloride), and PEDOT:PSS (i.e. poly(3,4-ethylenedioxythiophene) polystyrene sulfonate), which may be used as the material for the conductive area(s). Said materials may be particularly advantageous for the properties of the deformable sensor.

The conductive area(s) may be formed of conductive lines, filaments, or yarns crossing each other, whereby non-conductive area(s) are arranged in between the conductive lines, filaments, or yarns. The electrically permeable and conductive layer 140, 142 may be a woven layer (i.e. fabric) made of conductive yarn. Such conductive fabric includes the yarns as the conductive areas and non-conductive areas in between the yarns. Said materials may be particularly advantageous for the properties of the deformable sensor.

The first electrically permeable and/or conductive layer 140 may be uniformly conductive, e.g. by using conductive ink or paste a uniform amount on a uniform surface. In the alternative, the first electrically permeable and/or conductive layer 140 may be a mesh of conductive yarns, e.g. made using conductive ink or paste or filaments. It may also suffice that the first electrically permeable and/or conductive layer 140 consists of a meandering electrically conductive line. It may also suffice that the first electrically permeable and/or conductive layer 140 comprises multiple separate electrically conductive lines. In an embodiment, at least a part of the first electrically permeable and/or conductive layer 140 is made from a conductive ink. In an embodiment the first electrically permeable and/or conductive layer 140 comprises electrically conductive fabric. In an embodiment, the first electrically permeable and/or conductive layer 140 comprises electrically conductive polymer. Preferably, the first electrically permeable and/or conductive layer 140 is uniformly conductive. This may improve the reliability of the deformable sensor.

What has been said about the material of the first electrically permeable and/or conductive layer 140 applies to the material of the second electrically permeable and/or conductive layer 142.

The deformable sensor comprises a layer or layers that is/are stretchable and/or deformable. The deformable sensor 100 further comprises stretchable electrodes attached to this layer or one of these layers. The stretchability and the deformability can improve the comfort of the force sensor.

FIG. 1d shows the deformable sensor having more complex structure. The deformable sensor can comprise a first electrically permeable and/or conductive layer 140 and a second electrically permeable and/or conductive layer 142. For proper functionality, the second electrically permeable and/or conductive layer 142 can overlap in the direction of thickness of the sensor with [i] the whole area of the first primary electrode 301, [ii] the whole area of the second primary electrode 302, [iii] the whole area of the first secondary electrode 321, and [iv] the whole area of the second secondary electrode 322. When the deformable sensor comprises the electrically permeable and/or conductive layer(s) 140, 142 and further electrodes, the second electrically permeable and/or conductive layer 142 preferably overlaps in the direction of thickness of the sensor with all the electrodes.

The first secondary electrode 321 can be arranged in a direction of thickness Sz of the sensor 100 in between the second electrically permeable and/or conductive layer 142 and the flexible and stretchable layer 200. Moreover, a part of second elastic deformable layer 130B can be arranged in between the first secondary electrode 321 and the second electrically permeable and/or conductive layer 142. More specifically, a part of second elastic deformable layer 130B can be arranged [A] in between the first primary electrode 301 and the second electrically permeable and/or conductive layer 142 and [B] in between the first secondary electrode 321 and the second electrically permeable and/or conductive layer 142. The primary electrode(s) 301, 302 and the secondary electrode(s) 321, 322 can be left in between the second electrically permeable and/or conductive layer 142 and the first elastic deformable layer 130A in the direction Sz of the thickness of the sensor 100. Also, the wirings 400 can be left in between the second electrically permeable and/or conductive layer 142 and the first deformable layer 130A in the direction Sz of the thickness of the sensor 100.

Advantageously, the deformable sensor is a capacitive sensor. Alternatively, the deformable sensor is preferably a resistive sensor, or a piezoresistive sensor. Working principles of these sensors are known to a skilled person. The novel deformable sensor may be particularly advantageous when said sensor is one of these sensors. For example, signals of said sensors, when not calibrated, may not be accurately converted into measured values if the sensor is installed onto a non-planar surface.

As discussed above, the deformable sensor can be a capacitive sensor; hence, it can be configured to sense variations of capacitance and provide an output representative of the variations. The deformable sensor can be a capacitive sensor suitable to be positioned on double curved surfaces. The capacitive sensor can be, for example, a force and/or pressure sensor.

Typically, a capacitance of an electrode 300 relative to its surroundings changes, when an object is moved close to or away from the electrode. A second electrode (layer) is not necessarily needed, but two electrodes can be used for improved accuracy in such a way that material in between the electrodes can be compressed in use. When multiple electrodes are used at different locations, multiple local pressures can be determined at different locations. In touch sensors, the touching object (e.g. finger of a user) has a different dielectric constant than e.g. air. Thus, a capacitance of an electrode typically changes by movement of the touching object.

When the deformable sensor 100 comprises
the second elastic deformable layer 130B and the second electrically permeable and/or conductive layer 142, and
the first deformable layer 130A and the first electrically permeable and/or conductive layer 140, the second electrically permeable and/or conductive layer 142 is preferably arranged on a first side 133 of the elastic, deformable layer 130B and the first secondary electrode 321 is arranged on a second, opposite, side 134 of the elastic, deformable layer 130B. In an embodiment, the electrodes 300 and at least a part of the wirings 400 are arranged on the second, opposite, side 134 of the second elastic, deformable layer 130B. Correspondingly, a part of the second elastic, deformable layer 130B is left in between the second electrically permeable and/or conductive layer 142 and the first secondary electrode 321 in the direction Sz of the thickness of the sensor 100. Both the two electrically permeable and/or conductive layers 140, 142 and the two elastic, deformable layers 130A, 130B can improve the accuracy of capacitive measurements. In addition, the flexible and stretchable layer 200 in between the two elastic, deformable layers can simplify the manufacturing process. Furthermore, the mutual arrangement of electrodes and wiring can improve measurement accuracy, particularly for force, and without compromising reliability. Large electrodes (i.e. large coverage of electrodes) can be needed when the force is measured, since the force is an integral of pressure over the surface on which the force acts on. Thus, the pressure needs to be known at substantially all locations within the sensor to accurately determine the force.

The deformable sensor may comprise dummy wires and/or ground electrodes. In this case, to improve the structure of the deformable sensor, the shape of a dummy wire can be substantially similar to a shape of a wire adjacent thereto.

In accordance with an embodiment, the system comprises
analyzing means for analyzing data collected from the deformable sensor in order to determine a force and/or pressure and/or another value of interest based on the collected data and the assembly compensation coefficients 182.

In capacitive sensors, the capacitance of an electrode is measured. The capacitance can be measured relative to surroundings or relative to another electrode, such a ground electrode. In general there are three working principles: (1) the dielectric material close to the electrode (e.g. in between two electrodes) changes, which changes the capacitance; and/or (2) the distance between two electrodes changes, which changes the capacitance in between these electrodes; and/or (3) an area of an electrode changes or a mutual area between two electrode changes, which changes the capacitance of the electrode (e.g. relative to another electrode or surroundings). The mutual area may change e.g. under shear load. These principles are known to a skilled person.

With the sensor structure as discussed above, it is possible to measure a capacitance of a stretchable electrode 300 relative to something. The capacitance can be measured relative to another stretchable electrode 300. E.g. all other stretchable electrodes 300 may form a common ground, relative to which the capacitance may be measured. Thus, subsequently, the capacitance of all the stretchable electrodes 300 can be measured. This, however, decreases the sampling rate. It is also possible to measure capacitance relative to surroundings. This, however, may not give accurate results.

For example, force and/or pressure can be measured by using the capacitive sensor. Thus, the electronic arrangement 120 may be an integral part of the deformable sensor 100 for capacitively detecting force and/or pressure. Thus, the deformable sensor can be configured to sense variations of capacitance and provide an output representative of a pressure and/or force.

When the sensor 100 comprises two electrically permeable and/or conductive layers 140,142, the system is preferably configured to measure the capacitances from at least the whole area of the first primary electrode 301, the whole area of the second primary electrode 302, the whole area of the first secondary electrode 321, and the whole area of the second secondary electrode 322 relative to both the first and second electrically permeable and/or conductive layers 140, 142.

In particular, when the sensor comprises at least one electrically permeable and/or conductive layer 140,142; the electronic arrangement 120 may be configured to measure:
the capacitance from the whole area of the first primary electrode 301 relative to the electrically permeable and/or conductive layer (or layers) at one instance of time;
the capacitance from the whole area of the second primary electrode 302 relative to the electrically permeable and/or conductive layer (or layers) at one instance of time;
the capacitance from the whole area of the first secondary electrode 321 relative to the electrically permeable and/or conductive layer (or layers) at one instance of time; and
the capacitance from the whole area of the second secondary electrode 322 relative to the electrically permeable and/or conductive layer (or layers) at one instance of time.

These instances of times may be the same or they may be different.

The elastic, deformable layer 130A, 130B, 150 can be arranged in between the electrodes 300 and the first electrically permeable and/or conductive layer 140.

The first electrically permeable and/or conductive layer 140 may serve as a ground electrode, relative to which the capacitance of each of the stretchable electrodes 300 is measured. In such a configuration, the compression of the deformable layer 130A, 130B,150 affects the distance between two electrodes.

As known to a skilled person, the capacitance of such a capacitor formed by said two electrodes is inversely proportional to the distance between the electrodes. By measuring the capacitance, the distance between the electrodes can be calculated. From the distance, the strain within the elastic layer 150,130A can be determined. Since the material of the elastic layer 150,130A is known, the strain defines the stress (i.e. pressure) within the elastic layer 150, 130A. In this way, pressure at each stretchable electrode can be determined. Moreover, since the effective area of the stretchable electrode is known, the force affecting at that stretchable electrode can be determined. Finally, provided that the electrodes cover substantially the whole cross-sectional area of the sensor, the total force can be measured, when the assembly compensation coefficients, relating to a shape of a surface of the installing position of the deformable sensor, are known.

The deformable sensor 100 can be configured to sense pressure and/or force acting in a direction having a component in the direction Sz of the thickness of sensor 100. Correspondingly, a thickness of at least elastic, deformable layer (e.g. 130A or 130B) can be configured to decrease under pressure.

The deformable sensor 100 can be relatively thin. That is, the thickness is less than the smaller of length and width. In some applications, such as pressure sensing applications, the thickness two of the deformable sensor can be e.g. from 1 mm to 5 mm, in order to optimize measurement accuracy. In some other applications, such as touch based HMI, the thickness two of the deformable sensor can be e.g. from 0.05 mm to 1.0 mm, in order to optimized thinness and conformability of the deformable sensor. Further, in some other applications, such as a strain gauge, the thickness two of the deformable sensor can be e.g. from 0.02 mm to 0.5 mm for optimizing thinness and decreasing manufacturing cost of the deformable sensor.

Generally, for example in a force sensor, substantially all the measurement area should be covered by the electrodes used for measurements, while for example in a pressure sensor is suffices to provide electrodes used for measurements only to such areas, where the pressure is to be measured. In order to be able to measure the force (i.e. total force) in addition to pressure (i.e. local pressure), preferably substantially all the measurement area should be covered with the stretchable electrodes 300. Thus, the aforementioned distance $d_1$ (See FIG. 2b) should be small. On the other hand, if the distance $d_1$ is too small, neighboring electrodes 300 may capacitively couple to each other, which may disturb the measurements.

Generally, in the deformable sensors 100 configured to sense pressure and/or force, a thickness of the flexible and stretchable layer 200 may be e.g. up to 5 mm. In an embodiment, a thickness of the flexible and stretchable layer 200 that does not act as a compressible layer may be e.g. less 1 mm, such as less than 0.5 mm, e.g. from 20 µm to 1 mm or from 50 µm to 0.5 mm.

In order to have reasonable deformations, a thickness of the elastic, deformable layer(s) 130A, 1308 is preferably from 0.05 mm to 5 mm, such as from 0.3 mm to 4 mm, such as from 0.5 mm to 2 mm.

In the deformable sensors 100 configured to sense pressure and/or force, a thickness of the elastic, deformable layer(s) 130A, 130B, in order to have reasonable deformations, can be at least 0.05 mm, preferably at least 0.3 mm such as at least 0.5 mm.

Each one of the stretchable electrodes 300 can be arranged some distance apart from all other ones of the stretchable electrodes 300. The number of stretchable electrodes electrically insulated from each other by said distance typically correlates with the spatial accuracy of the sensor. The more electrodes 300 are used, the better the spatial accuracy. In a preferred embodiment, the number of stretchable electrodes is at least twenty, such as between 20 and 50.

Preferably, the first wire 401 connects only the first electrode 301 to the electronic arrangement 120 and the second wire 402 connects only the second electrode 302 to the electronic arrangement 120. This has the effect that, for example, the capacitances of the first and second electrode 301, 302 can be measured without multiplexing, which improves the temporal accuracy of the measurements. Thus, preferably, the electrode layer 300 comprises a second electrode 302 and a second wire 402 attached to the second electrode 302. This has the effect that the spatial accuracy of the capacitive measurements is improved. However, the capacitance may also be determined by multiplexing.

The first elastic, deformable layer 130A can be configured to be compressed and deform under pressure in use. In particular, because the deformable sensor is deformable and flexible, the flexibility allows for measurements of a pressure distribution with a high spatial accuracy, provided that a sufficient number of electrodes is used. The high number of individual electrodes may also improve the temporal accuracy, as indicated above.

The deformable sensor 100 is easily deformable due to material selections and a reasonably thin layered structure. The shape and/or the thickness of the sensor 100 can be adapted to the shape of the installing surface in which the sensor is positioned. Therefore, the deformable sensor is particularly suitable for use on a curved surface. In an advantageous embodiment, the deformable sensor 100 is suitable to be attached on double curved surfaces. Thus, particularly in use, the deformable sensor 100 needs not to be planar.

Such a sensor can be used in various application including, but not limited to, clothing, helmets, vehicles, and furniture. Thus, the installing surface in which the sensor is positioned can be, for example, a wearable item or a double curved surface of a vehicle. Furthermore, the sensor may be used in smart furniture, such as chairs, sofas, bedsheets, blankets, mattresses, rugs, and carpets, and objects inside a vehicle, such as vehicle chairs.

The deformable sensor 100 can be best suited for applications, wherein the deformable sensor deforms in use.

Humidity sweat or water may affect the measurement results. In particular, when the moisture come close to the electrodes 300, the moisture may affect the measurements a lot. Therefore, the material compensation coefficients 181 preferably include an information of an effect of moisture on the signals of the deformable sensor.

Further, a temperature may affect the measurement results. Thus, the material compensation coefficients 181 preferably include an effect of temperature on the signals of the deformable sensor.

Furthermore, the material compensation coefficients 181 can include information from
  stress vs. strain, and/or
  temperature vs. strain, and/or
  strain vs. resistance, and/or
  creep over time.

Thus, it is possible to obtain very reliable measurement results.

Thanks to the present invention, a value of interest, such as a pressure and/or force, can be monitored on complex surfaces, such as double curved surfaces and surfaces which deform in use.

Example 1: A Deformable Seat Sensor

The deformable seat sensor can be a pressure sensor.

Sensor material characterization results sensor material model, i.e., the material compensation coefficients 181. The material compensation coefficients 181 can include information from several non-linear sensor characteristics, e.g. stress vs. strain, and/or temperature vs. strain, and/or strain vs. resistance, and/or creep over time, etc. The material compensation coefficients 181 can be used by the computer measurement algorithm software to compensate material and structure based non-linearities for maximum sensor measurement accuracy. The material compensation coefficients are implemented as a matrix or multidimensional array including weighing coefficients to compensate non-linear characteristics of sensor materials and structure. In the software, material model can be implemented as a Look-Up-Table (LUT). FIG. 7a illustrates raw data (uncalibrated data) measurements. FIG. 7b illustrates material compensation coefficients for the raw data. FIG. 7c illustrate calibrated signals based on the raw data and the material compensation coefficients (calibrated signals=calibrated raw data×the material compensation coefficients).

The deformable seat sensor can be manufactured as a flat sensor. After the deformable seat sensor is manufactured, all individual pressure sensors can be measured with an algorithm utilizing the material compensation coefficients in the rest position. These sensor reference measurement values are stored for later use in the calibration compensating seat assembly impacts and variations.

The deformable seat sensor can be assembled into seating. In the assembly phase the sensor is partially stretched and/or bent in order to conform with the seat shape and materials. This shaping will have an impact on individual sensor measurement values.

The deformable seat sensor can obtain values after the assembly in the seat by using the initial material model. Due to deformations in the installation, measurement results (shown in FIG. 8a) are changed compared to initial reference measurement values, i.e. when the sensor was measured before the installation. Deformation has an impact on the dynamic measurement range, measurement linearity and sensitivity of the sensor or parts of the sensor. Therefore, algorithms with only initial material model is not sufficient to provide accurate measurement results after the installation to the seat.

In order to compensate the impact of the deformable seat sensor installation to the seat, additional calibration is required. This re-calibration is using the material compensation coefficients 181, measurements after the installation and optionally reference measurement results before installation. As a result of the recalibration, the assembly compensation coefficients (Shown in FIG. 8b) are formed. The result can be verified with additional measurement after re-calibration.

Thanks to the assembly compensation coefficients (Shown in FIG. 8b), the signals of the deformable sensor can be easily calibrated. Calibrated values after the assembly compensation are shown in FIG. 8c.

NUMBERED EXAMPLES

1. A deformable sensor arrangement comprising a deformable sensor suitable to be attached to a curved surface, which deformable sensor is preferably able to bend between a planar shape and a curved shape without breaking, the deformable sensor comprising
   an elastic layer having a Young's modulus at least 0.01 MPa and a first yield strain at least 10 percent at a temperature of 20° C.,
   a first stretchable electrode (301) attached to the elastic layer, and
   a stretchable electrically conductive wiring (400), wherein
   the first stretchable electrode is able to stretch at least 5% at a temperature of 20° C. without breaking, and
   the stretchable electrically conductive wiring (400) is able to stretch at least 5% at a temperature of 20° C. without breaking,
   wherein the deformable sensor arrangement further comprises
   an electronic arrangement (120) electrically coupled to the first stretchable electrode (301) via the stretchable electrically conductive wiring (400), which electronic arrangement (120) is configured to obtain a first signal from the first stretchable electrode (301) in an installation position of the deformable sensor,
   wherein the deformable sensor arrangement further comprises:
   analyzing means configured to determine a calibrated value based on the obtained first signal and assembly compensation coefficients, which assembly compensation coefficients are based on
      material compensation coefficients, and
      at least one other measured signal of the deformable sensor, which said at least one other measured signal was measured in said installing position when no object to be measured had an effect on the deformable sensor.

2. The deformable sensor arrangement according to example 1, wherein the deformable sensor arrangement comprises a temperature sensor.

3. The deformable sensor arrangement according to any of the preceding examples, wherein the material compensation coefficients include an effect of temperature on the first signal.

4. The deformable sensor arrangement according to any of the preceding examples, wherein
   the deformable sensor arrangement preferably comprises a moisture sensor, and
   the material compensation coefficients include an effect of moisture on the first signal of the deformable sensor.

5. The deformable sensor arrangement according to any of the preceding examples, wherein the material compensation coefficients include an effect of material(s) of the deformable sensor on the first signal of the deformable sensor.

6. The deformable sensor arrangement according to any of the preceding examples, wherein the material compensation coefficients include an effect of a structure of the deformable sensor on the first signal of the deformable sensor.

7. The deformable sensor arrangement according to any of the preceding examples, wherein the deformable sensor further comprises a second stretchable electrode (302) arranged a first distance ($d_1$, $d_{1,301,302}$) apart from the first stretchable electrode (301), wherein the electronic arrangement (120) is further coupled to the second stretchable electrode (302) via the wiring (400), and configured to obtain a second signal from the second stretchable electrode (302).

8. The deformable sensor arrangement according to example 7, wherein the material compensation coefficients include an effect of temperature on the second signal of the deformable sensor.

9. The deformable sensor arrangement according to example 7 or 8, wherein the material compensation coefficients include an effect of moisture on the second signal of the deformable sensor.

10. The deformable sensor arrangement according to any of the preceding examples 7 to 9, wherein the material compensation coefficients include an effect of material(s) of the deformable sensor on the second signal of the deformable sensor.

11. The deformable sensor arrangement according to any of the preceding examples 7 to 10, wherein the material compensation coefficients include an effect of a structure of the deformable sensor on the second signal of the deformable sensor.

12. The deformable sensor arrangement according to according to any of the preceding examples 7 to 11, wherein the analyzing means are configured to determine the calibrated value based on the obtained first and second signals and the assembly compensation coefficients.

13. The deformable sensor arrangement according to any of the preceding examples, wherein the analyzing means are further configured to
obtain said first signal when no object to be measured has an effect on the deformable sensor,
compare said first signal to at least one other signal stored to a memory, which said at least one other signal was obtained when the deformable sensor was installed to the current surface, and
determine whether the installing surface in which the sensor is positioned is still in suitable condition based on a difference between the first signal and the stored signal.

14. The deformable sensor arrangement according to any of the preceding examples, wherein the analyzing means comprise a processor, and the electronic arrangement (120) further comprises
transmitting means, such as a wireless component, and optionally at least one memory component.

15. The deformable sensor arrangement according to any of the preceding examples, wherein the deformable sensor is capable of being shaped into
a double curved form and/or
a curved form.

16. The deformable electronic arrangement according to any of the examples 1 to 15, wherein at least one wire (401, 402) of the wiring (400) is arranged as a meander wiring, at least partly.

17. The deformable sensor arrangement according to any of the preceding examples, wherein the electronic arrangement (120) is configured to send an output signal ($S_{out}$), the output signal ($S_{out}$) being indicative of the first signal and/or the calibrated value of the first signal.

18. The deformable sensor arrangement according to any of the preceding examples, wherein the deformable sensor comprises an elastic, deformable layer (130A, 130B) and a stretchable layer (200) in such a way that the stretchable layer (200), the stretchable electrode(s) (300, 301, 302), and the electrically conductive wiring (400) are left on a same side of the elastic deformable layer (130A).

19. The deformable sensor arrangement according to any of the preceding examples, wherein the elastic layer is an insulating layer and the deformable sensor further comprises an electrically permeable and/or conductive layer (140, 142).

20. The deformable sensor arrangement according to example 19, wherein the electronic arrangement (120) is electrically coupled to the electrically permeable and/or conductive layer (140, 142).

21. The deformable sensor arrangement according to any of the preceding examples, wherein the electronic arrangement (120) comprises an electronic chip (510) electrically coupled to the first electrode (301), and the analyzing means are preferably positioned in the electronic chip.

22. The deformable sensor arrangement according to any of the preceding examples, wherein the deformable sensor arrangement is configured to determine filtered values from the obtained signals, and the determination of the calibrated value(s) is based on the filtered values.

23. The deformable sensor arrangement according to any of the preceding examples, wherein the deformable sensor arrangement is configured to
determine material compensation coefficients (181) on a planar surface, and/or
use the material compensation coefficients stored to a memory.

24. The deformable sensor arrangement according to any of the preceding examples, wherein the deformable sensor arrangement is configured to
determine the assembly compensation coefficients (182) in an installing position of the deformable sensor when no object to be measured has an effect on the deformable sensor.

25. The deformable sensor arrangement according to any of the preceding examples, wherein the assembly compensation coefficients (182) are stored to memory of the electronic arrangement (120).

26. The deformable sensor arrangement according to any of the preceding examples, wherein the deformable sensor arrangement is attached to its position mechanically.

27. The deformable sensor arrangement according to any of the preceding examples, wherein the deformable sensor arrangement is attached to its position removably.

28. The deformable sensor arrangement according to any of the preceding examples 1 to 26, wherein the deformable sensor arrangement is attached to its position by using an adhesive.

29. The deformable sensor arrangement according to any of the preceding examples, wherein the electronic arrangement (120) further comprises a circuit board, preferably a flexible circuit board.

30. The deformable sensor arrangement according to example 29, wherein the circuit board (700) is electrically coupled to the first electrode (301).

31. The deformable sensor arrangement according to example 29 or 30, wherein an/the electronic chip (510) is attached to the circuit board (700).

32. The deformable sensor arrangement according to any of the preceding examples, wherein the deformable sensor is one of the following:
a capacitive sensor, or
a resistive sensor, or
a piezoresistive sensor.

33. A system comprising a deformable electronic sensor and an electronic arrangement configured to measure a value of interest by the deformable sensor, wherein
the deformable sensor, which is suitable to be attached to a curved object, comprises
an elastic layer having a Young's modulus at least 0.01 MPa and a first yield strain at least 10 percent at a temperature of 20° C.,
a first stretchable electrode (301) attached to the elastic layer, which first stretchable electrode is able to stretch, at a temperature of 20° C., at least 5% without breaking, and
a stretchable electrically conductive wiring (400), which is able to stretch, at a temperature of 20° C., at least 5% without breaking,
and
the electronic arrangement (120) is electrically coupled to the first stretchable electrode (301) via the wiring (400), which electronic arrangement is configured to obtain at least a first signal from the first stretchable electrode (301), and the electronic arrangement comprises a power source,
wherein the system further comprises
analyzing means configured to determine a calibrated value, in an installing position of the deformable sensor, based on the obtained signal(s) and assembly compensation coefficients (182), which assembly compensation coefficients are based on
material compensation coefficients, and
at least one other measured signal of the deformable sensor, in the installing position when no object to be measured had an effect on the deformable sensor,
transmitting means for transmitting at least some of the obtained values and/or calibrated values, and
optionally, an external unit (550, 570) for receiving the transmitted values.

34. The system according to example 33, wherein the system is configured to
determine material compensation coefficients (181) on a planar surface, and/or
use the material compensation coefficients stored to a memory.

35. The system according to any of the examples 33 or 34, wherein the system is configured to
determine the assembly compensation coefficients (182) in an installing position of the deformable sensor, and/or
use the assembly compensation coefficients stored to a memory.

36. The system according to any of the examples 33 to 35, comprising the deformable sensor arrangement according to any of the examples 1 to 32.

37. The system according to any of the examples 33 to 36, wherein the analyzing means are positioned in the external unit (550, 570), and the electronic arrangement (120) is configured to send a signal $S_{in}$ to the external unit (550, 570) which is configured to receive the signal ($S_{in}$) and determine the calibrated value.

38. The system according to any of the examples 33 to 37, wherein the external unit (550, 570) is an external control unit (550), such as a mobile phone, a tablet, or a personal computer or a cloud service unit (570).

39. The system according to example 38, wherein the external unit (550, 570) is the cloud service unit (570).

40. A method for determining a value of interest, the method comprising
providing a deformable sensor arrangement comprising a deformable sensor (100) and an electronic arrangement (120), the deformable sensor (100) comprising
an elastic layer having a Young's modulus at least 0.01 MPa and a first yield strain at least 10 percent at a temperature of 20° C.,
a first stretchable electrode (301) attached to the elastic layer,
and
a stretchable electrically conductive wiring (400),
wherein
the first stretchable electrode is able to stretch, at a temperature of 20° C., at least 5% without breaking, and
the stretchable electrically conductive wiring (400) is able to stretch, at a temperature of 20° C., at least 5% without breaking,
wherein
the electronic arrangement (120) is electrically coupled to the first stretchable electrode (301) via the wiring (400), which electronic arrangement is configured to obtain a first signal from the first stretchable electrode (301),
the method comprising
providing a first value by using the first stretchable electrode (301) of the deformable sensor,
reading the first value by using the electronic arrangement (120),
comparing the first value to assembly compensation coefficients (182), which assembly compensation coefficients are based on
material compensation coefficients, and
at least one other measured signal of the deformable sensor, which said at least one other measured signal was measured in an installing position when no object to be measured had an effect on the deformable sensor,
determining a calibrated first value based on assembly compensation coefficients and the read first value.

41. An installation method for installing a deformable sensor, the installation method comprising:
providing a deformable sensor arrangement comprising a deformable sensor (100) and an electronic arrangement (120),
the deformable sensor comprising
an elastic layer having a Young's modulus at least 0.01 MPa and a first yield strain at least 10 percent at a temperature of 20° C.,
a first stretchable electrode (301) attached to the elastic layer (150, 130A, 130B, 200), and
a stretchable electrically conductive wiring (400), wherein
the first stretchable electrode is able to stretch at least 5% at a temperature of 20° C. without breaking, and
the stretchable electrically conductive wiring (400) is able to stretch at least 5% at a temperature of 20° C. without breaking,
wherein the electronic arrangement (120) is electrically coupled to the first stretchable electrode (301) via the wiring (400), which electronic arrangement is configured to obtain a first signal from the first stretchable electrode (301),
the installation method comprising
providing material compensation coefficients (181),
installing the deformable sensor (100) against a first surface,
measuring signals of the deformable sensor (100) on the first surface when no object to be measured has an effect on the deformable sensor,
determining values indicating that no object to be measured has an effect on the deformable sensor on the first surface,
comparing the values indicating that no object to be measured has an effect on the sensor on the first surface to the material compensation coefficients (181) in order to determine assembly compensation coefficients (182).

42. The installing method according to example 41, wherein the providing material compensation coefficients comprises a step wherein the material compensation coefficients are read from a memory.

43. The installing method according to example 41 or 42, wherein the providing material compensation coefficients comprise the following steps:
measuring signals of the deformable sensor (100) on a planar surface when no object to be measured has an effect on the deformable sensor,
determining values indicating that no object to be measured has an effect on the deformable sensor on the planar surface,
storing said values to a memory as the material compensation coefficients and/or using said values as the material compensation coefficients.

44. A use of the deformable sensor according to any of the preceding examples 1 to 32 for
Human-Machine Interface (HMI), including e.g. touch and/or pressure sensor-based operation/control of a vehicle's functions, or
pressure sensing in a vehicle seating.

45. A use of the deformable sensor according to any of the preceding examples 1 to 32, for obtaining signals from a double curved surface so that the deformable sensor has a shape of the surface.

46. A use of the deformable sensor according to any of the preceding examples 1 to 32, for obtaining signals from a curved surface so that the deformable sensor has a shape of the surface.

47. A computer program for determining a value of interest, wherein the computer program, when run on a computer, is configured to cause the computer to
receive an input signal ($S_{in}$) indicative of a first signal measured by a deformable sensor on a first surface,
determine a calibrated value from the input signal ($S_{in}$) by using assembly compensation coefficients (182) on the first input signal ($S_{in}$),
which assembly compensation coefficients are based on material compensation coefficients, and
at least one other measured signal of the deformable sensor, which said at least one other measured signal was measured in the installing position of the deformable sensor when no object to be measured had an effect on the deformable sensor,
generate an output signal ($S_{out}$) comprising the calibrated value, and optionally, show the calibrated value to a user.

What is claimed is:

1. A deformable sensor arrangement comprising a deformable sensor to be attached to a curved surface, the deformable sensor comprising:
an elastic layer having a Young's modulus at least 0.01 MPa and a first yield strain at least 10% at a temperature of 20° C.;
a first stretchable electrode attached to the elastic layer; and
a stretchable electrically conductive wiring;
wherein:
the first stretchable electrode is able to stretch at least 5% at a temperature of 20° C. without breaking, and
the stretchable electrically conductive wiring is able to stretch at least 5% at a temperature of 20° C. without breaking;
wherein the deformable sensor arrangement further comprises
an electronic arrangement electrically coupled to the first stretchable electrode via the stretchable electrically conductive wiring, said electronic arrangement is configured to obtain a first signal from the first stretchable electrode in an installation position of the deformable sensor;
wherein the deformable sensor arrangement further comprises:
analyzing means configured to determine a calibrated value based on the obtained first signal and assembly compensation coefficients, said assembly compensation coefficients are based on:
material compensation coefficients, and
at least one other measured signal of the deformable sensor, said at least one other measured signal was measured in the installation position of the deformable sensor when no object to be measured had an effect on the deformable sensor;
wherein
the deformable sensor arrangement is configured to determine said material compensation coefficients on a planar surface, and/or material compensation coefficients are stored to a memory and the deformable sensor arrangement is configured to use said material compensation coefficients stored to a memory.

2. The deformable sensor arrangement according to claim 1, wherein the material compensation coefficients include an effect of
temperature, and/or
moisture
on the first signal of the deformable sensor.

3. The deformable sensor arrangement according to claim 1, wherein the material compensation coefficients include an effect of
material(s) of the deformable sensor, and/or
a structure of the deformable sensor on the first signal of the deformable sensor.

4. The deformable sensor arrangement according to claim 1, wherein the analyzing means are further configured to:
obtain said first signal when no object to be measured has an effect on the deformable sensor,
compare said first signal to a signal stored to a memory, said stored signal was obtained when the deformable sensor was installed to the current surface,
determine whether the installing surface in which the sensor is positioned is still in suitable condition based on a difference between the first signal and the stored signal.

5. The deformable sensor arrangement according to claim 1, wherein the analyzing means comprise a processor, and the electronic arrangement further comprises transmitting means and, at least one component with memory.

6. The deformable sensor arrangement according to claim 1, wherein the deformable sensor comprises an elastic, deformable layer and a stretchable layer in such a way that the stretchable layer, the stretchable electrode(s), and the electrically conductive wiring are left on a same side of the elastic deformable layer.

7. The deformable sensor arrangement according to claim 1, wherein the electronic arrangement comprises an electronic chip electrically coupled to the first electrode, and the analyzing means are positioned in the electronic chip.

8. The deformable sensor arrangement according to claim 1, wherein the deformable sensor arrangement is configured to:
determine the assembly compensation coefficients in the installation position of the deformable sensor when no object to be measured has an effect on the deformable sensor.

9. The deformable sensor arrangement according to claim 1, wherein the deformable sensor is one of the following:
a capacitive sensor; or
a resistive sensor; or
a piezoresistive sensor.

10. The deformable sensor arrangement according to claim 1, wherein the deformable sensor comprises at least one layer comprising one or more transparent areas.

11. The deformable sensor arrangement according to claim 1, wherein the deformable sensor comprises equal to or less than 6 layers comprising one or more transparent areas.

12. A method of using the deformable sensor according to claim 1, comprising obtaining signals from:

a curved surface, or a double curved surface.

13. A computer program for determining a value of interest, wherein the computer program, when run on a computer, is configured to cause the computer to:
receive an input signal indicative of the first signal measured by the deformable sensor according to claim 1 on a first surface,
determine the calibrated value from the input signal by using assembly compensation coefficients on the first input signal, said assembly compensation coefficients are based on:
material compensation coefficients, said material compensation coefficients were determined on the planar surface, and/or stored to the memory and used from the memory, and
at least one other measured signal of the deformable sensor, said at least one other measured signal was measured in the installation position of the deformable sensor when no object to be measured had an effect on the deformable sensor,
generate an output signal comprising the calibrated value, and
show the calibrated value to a user.

14. The deformable sensor arrangement according to claim 1, wherein the analyzing means comprise a processor, and the electronic arrangement further comprises transmitting means.

15. A system for determining a value of interest comprising a deformable electronic sensor and an electronic arrangement configured to measure a value of interest by the deformable sensor, wherein:
the deformable sensor, which is configured to be attached to a curved object, comprises:
an elastic layer having a Young's modulus at least 0.01 MPa and a first yield strain at least 10% at a temperature of 20° C.,
a first stretchable electrode attached to the elastic layer, said first stretchable electrode is able to stretch, at a temperature of 20° C., at least 5% without breaking, and
a stretchable electrically conductive wiring, which is able to stretch, at a temperature of 20° C., at least 5% without breaking; and
the electronic arrangement is electrically coupled to the first stretchable electrode via the wiring, which electronic arrangement is configured to obtain at least a first signal from the first stretchable electrode, and the electronic arrangement comprises a power source,
wherein the system further comprises:
analyzing means configured to determine a calibrated value, in an installing position of the deformable sensor, based on the obtained signal(s) and assembly compensation coefficients, said assembly compensation coefficients are based on:
material compensation coefficients, and the deformable sensor arrangement is configured to determine the material compensation coefficients on a planar surface, and/or the material compensation coefficients are stored to a memory and the deformable sensor arrangement is configured to use said material compensation coefficients stored to a memory, and
at least one other measured signal of the deformable sensor, said at least one other measured signal was measured in the installing position when no object to be measured had an effect on the deformable sensor, transmitting means for transmitting at least some of the obtained values and/or calibrated values, and
an external unit for receiving the transmitted values.

16. A method for determining a value of interest, the method comprising:
providing a deformable sensor arrangement comprising a deformable sensor and an electronic arrangement; the deformable sensor comprising:
an elastic layer having a Young's modulus at least 0.01 MPa and a first yield strain at least 10% at a temperature of 20° C.,
a first stretchable electrode attached to the elastic layer, and
a stretchable electrically conductive wiring,
wherein
the first stretchable electrode is able to stretch, at a temperature of 20° C., at least 5% without breaking, and
the stretchable electrically conductive wiring is able to stretch, at a temperature of 20° C., at least 5% without breaking,
wherein
the electronic arrangement is electrically coupled to the first stretchable electrode via
the wiring, and the electronic arrangement is configured to obtain a first signal from the first stretchable electrode,
wherein the method comprises:
providing a first value by using the first stretchable electrode of the deformable sensor,
reading the first value by using the electronic arrangement,
comparing the first value to assembly compensation coefficients, said assembly compensation coefficients are based on:
material compensation coefficients, and the deformable sensor arrangement is configured to determine the material compensation coefficients on a planar surface, and/or material compensation coefficients are stored to a memory and the deformable sensor arrangement is configured to use said material compensation coefficients stored to a memory, and
at least one other measured signal of the deformable sensor, said at least one other measured signal was measured in an installing position when no object to be measured had an effect on the deformable sensor,
determining a calibrated first value based on the assembly compensation coefficients and the read first value.

17. An installation method for installing a deformable sensor, the installation method comprising:
providing a deformable sensor arrangement comprising a deformable sensor and an electronic arrangement,
the deformable sensor comprising:
an elastic layer having a Young's modulus at least 0.01 MPa and a first yield strain at least 10 percent at a temperature of 20° C.,
a first stretchable electrode attached to the elastic layer, and
a stretchable electrically conductive wiring,
wherein
the first stretchable electrode is able to stretch at least 5% at a temperature of 20° C. without breaking, and
the stretchable electrically conductive wiring is able to stretch at least 5% at a temperature of 20° C. without breaking,
wherein the electronic arrangement is electrically coupled to the first stretchable electrode via the wiring, said electronic arrangement is configured to obtain a first signal from the first stretchable electrode, wherein the installation method comprises:

providing material compensation coefficients by determining the material compensation coefficients on a planar surface and/or using the material compensation coefficients stored to a memory, installing the deformable sensor against a first surface, measuring at least one signal on the first surface when no object to be measured has an effect on the deformable sensor, determining values indicating that no object to be measured has an effect on the deformable sensor on the first surface, comparing the values indicating that no object to be measured has an effect on the sensor on the first surface to the material compensation coefficients in order to determine assembly compensation coefficients.

\* \* \* \* \*